US009608188B2

(12) United States Patent
Reifenberg et al.

(10) Patent No.: US 9,608,188 B2
(45) Date of Patent: *Mar. 28, 2017

(54) THERMOELECTRIC DEVICES HAVING REDUCED THERMAL STRESS AND CONTACT RESISTANCE, AND METHODS OF FORMING AND USING THE SAME

(71) Applicant: Alphabet Energy, Inc., Hayward, CA (US)

(72) Inventors: John Reifenberg, Pleasanton, CA (US); Lindsay Miller, Berkeley, CA (US); Matthew L. Scullin, San Francisco, CA (US); Adam Lorimer, Walnut Creek, CA (US); Sravan Kumar R. Sura, Fremont, CA (US); Sasi Bhushan Beera, Fremont, CA (US); Douglas Crane, Richmond, CA (US)

(73) Assignee: Alphabet Energy, Inc., Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,671

(22) Filed: May 8, 2015

(65) Prior Publication Data
US 2015/0243868 A1    Aug. 27, 2015

Related U.S. Application Data

(63) Continuation of application No. 14/469,404, filed on Aug. 26, 2014, now Pat. No. 9,065,017.
(Continued)

(51) Int. Cl.
H01L 35/04    (2006.01)
H01L 35/22    (2006.01)
H01L 35/34    (2006.01)

(52) U.S. Cl.
CPC .............. *H01L 35/04* (2013.01); *H01L 35/22* (2013.01); *H01L 35/34* (2013.01)

(58) Field of Classification Search
None
See application file for complete search history.

(56) References Cited

U.S. PATENT DOCUMENTS 4,292,579 A    9/1981  Constant
4,959,119 A    9/1990  Lantzer
(Continued)

FOREIGN PATENT DOCUMENTS

JP    2009/260173    11/2009
WO   WO 2006/049285    5/2006
(Continued)

OTHER PUBLICATIONS

Chen et al., "Dispenser-printed thick film thermoelectric materials," Proceedings of PowerMEMS Conference, Dec. 2010, pp. 223-226.
(Continued)

Primary Examiner — Asok K Sarkar
(74) Attorney, Agent, or Firm — K&L Gates LLP

(57) ABSTRACT

A method includes preparing a thermoelectric material including p-type or n-type material and first and second caps including transition metal(s). A powder precursor of the first cap can be loaded into a sintering die, punches assembled thereto, and a pre-load applied to form a first pre-pressed structure including a first flat surface. A punch can be removed, a powder precursor of the p-type or n-type material loaded onto that surface, the punch assembled to the die, and a second pre-load applied to form a second pre-pressed structure including a second substantially flat surface. The punch can be removed, a powder precursor of the second cap loaded onto that surface, the first punch assembled to the die, and a third pre-load applied to form a third pre-pressed
(Continued)

structure. The third pre-pressed structure can be sintered to form the thermoelectric material; the first or second cap can be coupled to an electrical connector.

41 Claims, 14 Drawing Sheets

Related U.S. Application Data

(60) Provisional application No. 61/872,745, filed on Sep. 1, 2013, provisional application No. 61/955,323, filed on Mar. 19, 2014.

(56) References Cited

U.S. PATENT DOCUMENTS

| | | | |
|---|---|---|---|
| 5,723,799 A | 3/1998 | Murayama et al. | |
| 5,959,341 A | 9/1999 | Tsuno et al. | |
| 6,314,741 B1 | 11/2001 | Hiraishi | |
| 6,389,983 B1 | 5/2002 | Coester et al. | |
| 6,410,971 B1 | 6/2002 | Otey | |
| 6,700,052 B2 | 3/2004 | Bell et al. | |
| 6,410,971 C1 | 4/2008 | Otey | |
| 7,531,739 B1 | 5/2009 | Moczygemba | |
| 7,999,172 B2 | 8/2011 | Yu | |
| 9,065,017 B2 | 6/2015 | Reifenberg et al. | |
| 2001/0002319 A1 | 5/2001 | Tauchi et al. | |
| 2006/0017170 A1 | 1/2006 | Chen et al. | |
| 2006/0053969 A1 | 3/2006 | Harada et al. | |
| 2006/0179820 A1 | 8/2006 | Sullivan | |
| 2007/0095383 A1 | 5/2007 | Tajima | |
| 2007/0290322 A1 | 12/2007 | Zhao et al. | |
| 2008/0023057 A1 | 1/2008 | Nakajima et al. | |
| 2008/0308140 A1 | 12/2008 | Nakamura | |
| 2009/0025771 A1 | 1/2009 | Stark | |
| 2010/0011781 A1 | 1/2010 | Lents et al. | |
| 2010/0167444 A1 | 7/2010 | Chen et al. | |
| 2010/0236595 A1 | 9/2010 | Bell et al. | |
| 2011/0016888 A1 | 1/2011 | Haass et al. | |
| 2011/0018155 A1 | 1/2011 | Stefan et al. | |
| 2011/0020969 A1 | 1/2011 | Haas et al. | |
| 2011/0114146 A1 | 5/2011 | Scullin | |
| 2011/0168223 A1 | 7/2011 | Dede et al. | |
| 2011/0204500 A1 | 8/2011 | Lim et al. | |
| 2011/0252774 A1 | 10/2011 | Spieth et al. | |
| 2011/0258995 A1 | 10/2011 | Limbeck et al. | |
| 2012/0000500 A1 | 1/2012 | Iida et al. | |
| 2012/0042661 A1 | 2/2012 | Danenberg et al. | |
| 2012/0057305 A1 | 3/2012 | Morisaku et al. | |
| 2012/0097206 A1 | 4/2012 | Sadaoka et al. | |
| 2012/0098162 A1 | 4/2012 | Snyder et al. | |
| 2012/0118343 A1 | 5/2012 | Iida et al. | |
| 2012/0152294 A1 | 6/2012 | Kim et al. | |
| 2012/0152295 A1 | 6/2012 | Matus et al. | |
| 2012/0207641 A1 | 8/2012 | Rubio et al. | |
| 2012/0247527 A1 | 10/2012 | Scullin et al. | |
| 2012/0295074 A1 | 11/2012 | Yi et al. | |
| 2012/0319082 A1 | 12/2012 | Yi et al. | |
| 2013/0001480 A1 | 1/2013 | Malik et al. | |
| 2013/0146116 A1 | 6/2013 | Jovovic et al. | |
| 2013/0175654 A1 | 7/2013 | Muckenhirn et al. | |
| 2013/0186445 A1 | 7/2013 | Lorimer et al. | |
| 2013/0187130 A1 | 7/2013 | Matus et al. | |
| 2013/0199337 A1 | 8/2013 | Udono et al. | |
| 2014/0024163 A1 | 1/2014 | Aguirre et al. | |
| 2014/0036951 A1* | 2/2014 | Caroff | G01K 7/02 374/29 |
| 2014/0116491 A1 | 5/2014 | Reifenberg et al. | |
| 2014/0182644 A1 | 7/2014 | Aguirre et al. | |
| 2014/0193982 A1 | 7/2014 | Yi et al. | |
| 2014/0318588 A1 | 10/2014 | Kouma et al. | |

FOREIGN PATENT DOCUMENTS

| | | |
|---|---|---|
| WO | WO 2009/026466 | 2/2009 |
| WO | WO 2011/060149 | 5/2011 |
| WO | WO 2012/068426 | 5/2012 |
| WO | WO 2012/075359 | 6/2012 |
| WO | WO 2012/088085 | 6/2012 |
| WO | WO 2012/161757 | 11/2012 |
| WO | WO 2013/010547 | 1/2013 |
| WO | WO 2013/112710 | 8/2013 |
| WO | WO 2013/119755 | 8/2013 |
| WO | WO 2014/084315 | 6/2014 |

OTHER PUBLICATIONS

Goncalves et al., "Fabrication of flexible thermoelectric microcoolers using planar thin film technologies," J. Micromec. Microeng. 17: S168-S173 (2007).
Patent Cooperation Treaty, International Search Report, mailed May 28, 2013, in Application No. PCT/US2013/022930.
Patent Cooperation Treaty, Written Opinion, mailed May 28, 2013, in Application No. PCT/US2013/022930.
Patent Cooperation Treaty, International Search Report, mailed Mar. 10, 2014, in Application No. PCT/US2013/064812.
Patent Cooperation Treaty, Written Opinion, mailed Mar. 10, 2014, in Application No. PCT/US2013/064812.
Patent Cooperation Treaty, International Search Report, mailed Jan. 27, 2015, in Application No. PCT/US2014/053102.
Patent Cooperation Treaty, Written Opinion, mailed Jan. 27, 2015, in Application No. PCT/US2014/053102.
Patent Cooperation Treaty, International Search Report, mailed Jul. 23, 2015, in Application No. PCT/US2015/024484.
Patent Cooperation Treaty, Written Opinion, mailed Jul. 23, 2015, in Application No. PCT/US2015/024484.
Sakamoto et al., "The Use of Transition-Metal Silicides to Reduce the Contact Resistance Between the Electrode and Sintered n-Type Mg2Si," J. Electronic Materials 41(6):1805-1810 (2012).
Sakamoto et al., "Formation of Ni Electrodes on Sintered N-type Mg2Si Using Monobloc Sintering and Electroless Plating Methods," AIP Conf. Proc., 1449:223-226 (2012).
United States Patent and Trademark Office, Office Action issued in U.S. Appl. No. 13/749,470, mailed Apr. 21, 2015.
United States Patent and Trademark Office, Office Action issued in U.S. Appl. No. 13/947,400, mailed Oct. 3, 2014.
United States Patent and Trademark Office, Notice of Allowance issued in U.S. Appl. No. 13/947,400, mailed Mar. 24, 2015.
United States Patent and Trademark Office, Notice of Allowance issued in U.S. Appl. No. 13/947,400, mailed Jul. 6, 2015.

\* cited by examiner

THERMOELECTRIC DEVICES HAVING REDUCED THERMAL STRESS AND CONTACT RESISTANCE, AND METHODS OF FORMING AND USING THE SAME

CROSS-REFERENCE TO RELATED APPLICATIONS

This application is a continuation under 35 U.S.C. §120 of U.S. patent application Ser. No. 14/469,404, filed on Aug. 26, 2014 and entitled "Thermoelectric Devices Having Reduced Thermal Stress and Contact Resistance, and Methods of Forming and Using the Same," the entire contents of which are incorporated by reference herein, which claims priority to the following applications, the entire contents of both of which are incorporated by reference herein:

U.S. Provisional Patent Application No. 61/872,745, filed Sep. 1, 2013 and entitled "Thermal Stress and CTE Mismatch Management in Thermoelectric Package;" and U.S. Provisional Patent Application No. 61/955,323, filed Mar. 19, 2014 and entitled "Bulk Metal-Capped Thermoelectric-Composite Sandwich Structure and Method Thereof."

BACKGROUND

The present invention is directed to structure and method of thermoelectric device package according to certain embodiments. More particularly, some embodiments of the invention provide structure and method for reducing thermal stresses in thermoelectric legs during manufacturing a thermoelectric device. Merely by way of example, it has been applied for using CTE (coefficient of thermal expansion) matching ductile materials at the interface between thermoelectric materials and shunts on ceramic base plate. It would be recognized that the invention has a much broader range of applicability.

Additionally, the present invention is directed to thermoelectric composite structures and methods of making the same according to some embodiments. More particularly, certain embodiments of the invention provide a bulk thermoelectric composite material capped with two metal layers forming a structure for the manufacture and assembly of thermoelectric elements for large-scale thermoelectric power systems. Merely by way of example, the invention presents a method of co-sintering powdered thermoelectric composite materials with powdered metal material on top and bottom to form a bulk metal-capped thermoelectric sandwich structure capable of making a plurality of thermoelectric elements that may be sorted by thermoelectric performance for the manufacture of a custom-scaled thermoelectric module and are mechanically and electrically robust. However, it would be recognized that the invention has a much broader range of applicability.

Thermoelectric devices are often packaged using a plurality of thermoelectric legs arranged in multiple serial chain configurations on a base structure. Each of the plurality of thermoelectric legs is made by either p-type or n-type thermoelectric material. The thermoelectric (TE) material, either p-type or n-type, is selected from semiconductor characterized by high electrical conductivity and high thermal resistivity. One p-type leg is pairwisely coupled to one n-type leg via a conductor from each direction in the serial chain configuration, one conductor being coupled at one end region of the leg and another conductor being coupled at another end region of the leg. When the thermoelectric device is applied with a bias voltage across the top/bottom regions using the two conductors as two electrodes, a temperature difference is generated so that the thermoelectric device can be used as a refrigeration (e.g., Peltier) device. When the thermoelectric device is disposed to a thermal junction with conductors at first end regions of the legs being attached to a cold side of the junction and conductors at second end regions of the legs being in contact with a hot side of the junction, the thermoelectric device is able to generate electrical voltage across the junction as an energy conversion (e.g., Seebeck) device.

The energy conversion efficiency of thermoelectric devices can be measured by a so-called thermal power density or "thermoelectric figure of merit" ZT, where ZT is equal to $TS^2\sigma/k$ where T is the temperature, S is the Seebeck coefficient, $\sigma$ is the electrical conductivity, and k is the thermal conductivity of the thermoelectric material. In order to drive up value of ZT of thermoelectric devices utilizing the Seebeck effect, on the one hand, efforts are made for searching high performance thermoelectric materials and developing low cost manufacture processes, on other hand, efforts also are needed for improving thermoelectric leg packaging techniques whenever the any high-performance thermoelectric materials are available. Additionally, there are needs for improving manufacturability of the high performance bulk-size thermoelectric legs that are packaged into thermoelectric devices.

For example, different types of materials may be provided for forming p or n type legs and for forming cold or hot-side contacts. During a package process to assemble them together, large thermal stresses during device operation would be a key problem to overcome, e.g., when more thermoelectric applications push the hot-side temperature exceeding 600° C. Further, bond strength between different thermoelectric materials in package would also be one of the big issues, as newly developed thermoelectric material combinations and new operation environment requirements raise more challenges as well as opportunities.

For example, the thermoelectric legs made of or including either n-type or p-type thermoelectric materials integrated with conductive material as an electrical contact at both ends before the legs (on a size scale of a few millimeters cubed) can be diced from a larger raw pellet. Conventionally, a series of sputtered or evaporated conductive thin films are formed on a thermoelectric material to make electrical contact to the thermoelectric elements for assembling into a module. There are multitudes of challenges with such thin films on various thermoelectric materials with high performance properties. Most issues include film delaminating and cracking or the whole piece of thermoelectric material cracking during the formation of individual thermoelectric legs or elements. The thin film electrical contacts mentioned above are used for contact and bonding but they are too thin by themselves to allow direct measurement of the electrical properties of the thermoelectric material. The thin film does not provide low enough electrical resistance to allow for sufficient current spreading across the leg cross-section. This results in a high resistance measurement and one that could differ depending on where on the surface the measuring probe makes contact.

It is commonly known that the properties of thermoelectric materials vary throughout a large sample such that small subsamples diced from the as-manufactured large sample have a wide range of properties compared to those measured from the large sample. Many thermoelectric materials are mechanically brittle, prone to cracking as thickness of the manufactured pellet changes, and hard to dice into the final thermoelectric legs with desired form factor without breaking Even though a relatively large piece of thermoelectric material with metal contacts can be made, its electrical properties can only be estimated on average as a whole piece of material without being able to properly determine the individual leg performance after dicing. For a thermoelectric material with thin film electrical contacts, binning of the thermoelectric legs by selected performance level is not possible prior to building the full thermoelectric system.

Merely as an intermediate material, the thin film electrical contacts mentioned above also suffer from poor electrical conduction due to film cracking, parasitic resistances, and bond failure, leading to poor electrical integration when assembling into thermoelectric power generation systems. Alternatively, co-sintering of metal foils with thermoelectric materials has been attempted, but the metal foils often experience problems of poor bonding with the thermoelectric material.

SUMMARY OF THE INVENTION

Therefore, it is desired to have improved techniques for packaging thermoelectric legs with reduced thermal stress associated with newly developed composite thermoelectric leg materials and simplifying process steps for making high performance thermoelectric device with low cost. Details about one or more techniques using coefficient of thermal expansion (CTE) matching across bonding regions of each thermoelectric leg for packaging thermoelectric devices are presented as various embodiments throughout this specification and particularly below.

Additionally, it is highly desirable to develop an improved thermoelectric composite material to overcome thermoelectric material cracking (during either sintering or dicing), poor adhesion between metal contacts with the thermoelectric material, variation in performance across relatively large pellet, and to provide a method for making the same thermoelectric composite material with the ability to measure the properties of the small diced thermoelectric elements prior to installing them in the power generation system. Many benefits are expected upon the application of various embodiments of the present invention. One of them is the ability to control thermoelectric property variations out of the sintered thermoelectric composite material pellet due to defects, agglomerates, presence of various material phases, variations of component concentrations, and other stochastic phenomena. Another benefit of certain embodiments of the present invention lies in the enhancement of mechanical robustness of individual thermoelectric legs diced from the co-sintered pellet with the metal-capped thermoelectric composite structure. An alternate benefit of some embodiments of the present invention also lies in the enhancement of electrical robustness of individual thermoelectric legs diced from the co-sintered pellet with the metal-capped thermoelectric composite structure. Details about the improved structure and related manufacture method are presented below.

Under one aspect, according to one embodiment, a method of forming a thermoelectric device includes preparing a thermoelectric material including a p-type or n-type material and first and second caps respectively including first and second cap materials respectively disposed on either side of the p-type or n-type material, the first and second cap materials each respectively including an independently selected transition metal. Forming the thermoelectric material can include loading a powder precursor of the first cap material into a sintering die; assembling one or more punches to the powder precursor of the first cap material in the sintering die; and applying a first pre-load via the one or more punches to the powder precursor of the first cap material to form a first pre-pressed structure including a first substantially flat surface. Forming the thermoelectric material further can include removing a first punch of the one or more punches to expose the first substantially flat surface; loading a powder precursor of the p-type or n-type material into the sintering die and onto the exposed first substantially flat surface; assembling the first punch to the powder precursor of the p-type or n-type material in the sintering die; and applying a second pre-load via the one or more punches to the first pre-pressed structure and the powder precursor of the p-type or n-type material to form a second pre-pressed structure including a second substantially flat surface. Forming the thermoelectric material further can include removing the first punch to expose the second substantially flat surface; loading a powder precursor of the second cap material into the sintering die and onto the exposed second substantially flat surface; assembling the first punch to the powder precursor of the second cap material in the sintering die; and applying a third pre-load via the one or more punches to the second pre-pressed structure and the powder precursor of the second cap to form a third pre-pressed structure. Forming the thermoelectric material further can include sintering the third pre-pressed structure to form the thermoelectric material; and coupling at least one of the first and second caps of the thermoelectric material to an electrical connector.

Under another aspect, according to another embodiment, a thermoelectric device includes a thermoelectric material including a p-type or n-type material and first and second caps respectively including first and second cap materials respectively disposed on either side of the p-type or n-type material, the first and second cap materials each respectively including an independently selected transition metal. The thermoelectric material can be formed by co-sintering a powder precursor of the first cap material, a powder precursor of the p-type or n-type material, and a powder precursor of the second cap material in a sintering die. A particle size ratio of the powder precursor of the p-type or n-type material to the powder precursors of the first and second cap materials can be in the range of approximately 1:1 to approximately 1:50. The device also can include an electrical connector, at least one of the first and second caps of the thermoelectric material being coupled to the electrical connector.

Under yet another aspect, according to yet another embodiment, a method of forming a thermoelectric device can include providing a thermoelectric material including a p-type or n-type material and first and second caps respectively including first and second cap materials respectively disposed on either side of the p-type or n-type material, the first and second cap materials each respectively including an independently selected transition metal, wherein a thickness of each of the first and second caps is approximately 0.2 mm to approximately 2 mm. The method further can include dicing the thermoelectric material to form a plurality of individual thermoelectric legs; testing an electrical resistance of each of the individual thermoelectric legs; sorting the individual thermoelectric legs based on the tested electrical resistance; and coupling at least one of the first and second caps of at least one of the sorted individual thermoelectric legs to an electrical connector.

DETAILED DESCRIPTION

The present invention is directed to structure and method of thermoelectric device package according to certain embodiments. More particularly, some embodiments of the invention provides structure and method for reducing thermal stresses in thermoelectric legs during manufacturing of a thermoelectric device. Merely by way of example, it has been applied for using CTE (coefficient of thermal expansion) matching ductile materials at the interface between thermoelectric materials and shunts on ceramic base plate. It would be recognized that the invention has a much broader range of applicability.

Additionally, the present invention is directed to thermoelectric composite structures and methods of making the same according to some embodiments. More particularly, certain embodiments of the invention provide a bulk thermoelectric composite material capped with two metal layers forming a structure for the manufacture and assembly of thermoelectric elements for large-scale thermoelectric power systems. Merely by way of example, the invention presents a method of co-sintering powdered thermoelectric composite materials with powdered metal material on top and bottom to form a bulk metal-capped thermoelectric sandwich structure capable of making a plurality of thermoelectric elements that may be sorted by thermoelectric performance for the manufacture of a custom-scaled thermoelectric module and are mechanically and electrically robust. However, it would be recognized that the invention has a much broader range of applicability.

For example, embodiments of the present invention provide thermoelectric devices having reduced thermal stress and contact resistance, and methods of forming and using the same. In an illustrative embodiment, a thermoelectric device can include a thermoelectric material that includes p-type or n-type material and first and second caps respectively including first and second cap materials respectively disposed on either side of the p-type or n-type material. The first and second cap materials each can respectively include an independently selected transition metal. As described in greater detail herein, the method by which the thermoelectric material is made, or the materials used to form the p-type or n-type material, or the dimensions of the materials, or any suitable combination of the foregoing can reduce mismatch in coefficient of thermal expansion (CTE) between the p-type or n-type material and the first and second cap materials, can improve bonding between the p-type or n-type material and the first and second cap materials, can improve durability of the thermoelectric device, can improve resistance of thermoelectric legs formed using the thermoelectric material, and can improve the percentage of thermoelectric legs formed using the material that have a satisfactory resistance.

Figure 1:
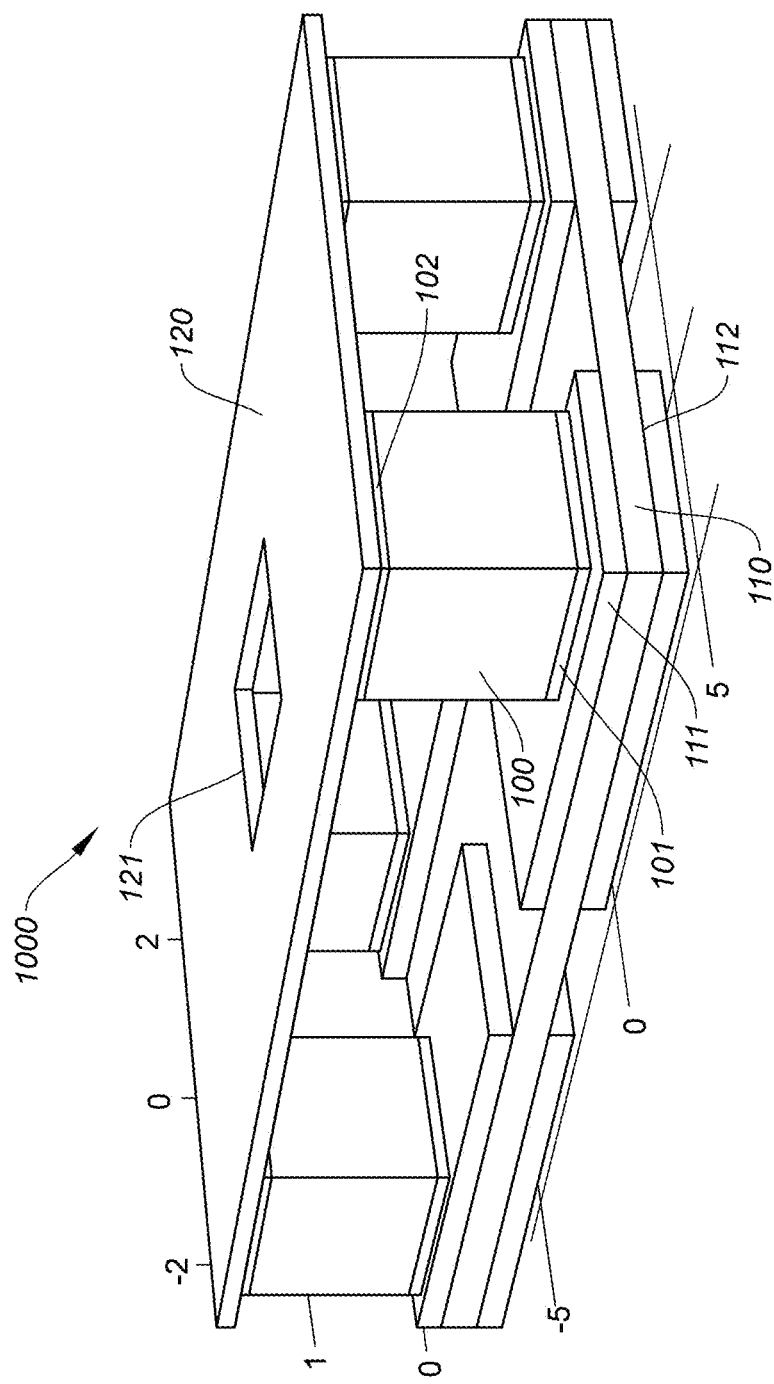
FIG. 1 illustrates a thermoelectric device package.
Figure 2:
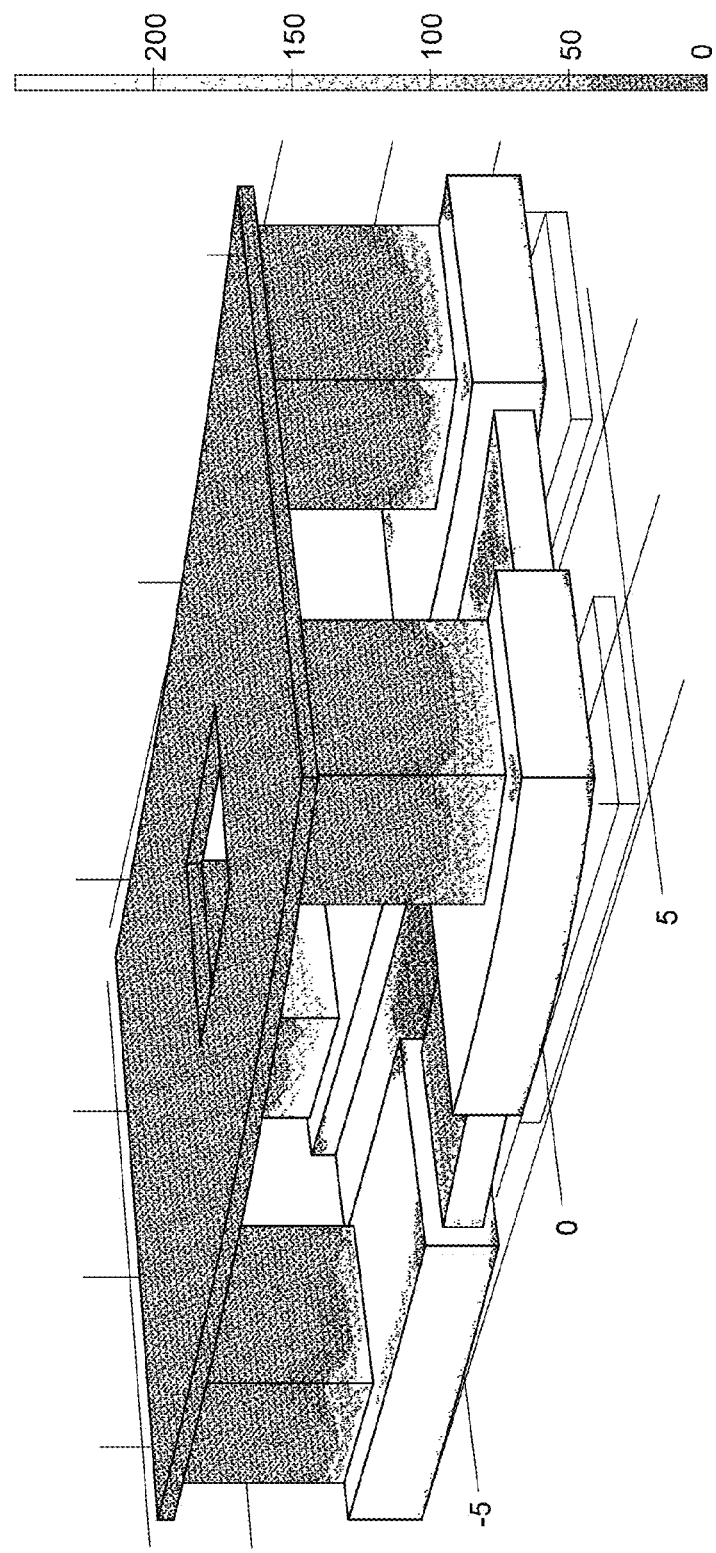
FIG. 2 illustrates results of an exemplary 3-dimensional (3D) stress mapping calculation performed on the thermoelectric device package of FIG. 1.

For example, FIG. 1 is a schematic diagram of a structure 1000 including a pair of thermoelectric (TE) unicouples disposed on a base structure and capped by a shunt material according to a thermoelectric package, and FIG. 2 illustrates results of an exemplary 3-dimensional (3D) stress mapping calculation performed on the thermoelectric package of FIG. 1. Presenting the TE structure 1000 and its subsequent thermal stress analysis is utilized as part of the invention process for developing the improved CTE matching thermoelectric leg package and associated methods according to certain embodiments as described elsewhere herein.

As shown in FIG. 1, the two redundant pair of TE unicouples, or a TE unit 1000 including four TE legs, are disposed with alignment onto respective locations of a base plate 110. In the illustrated embodiment, the base plate 110 is an electrical insulator material but with relatively good thermal conduction characteristics. In an example, the base plate includes, or is made by, a ceramic material, such as silicon nitride $Si_3N_4$ material. In another specific example, as shown in FIG. 1, a metal pad 111 is inserted between a first end region 101 of each TE leg 100 (e.g., a p-type or n-type material) and the base plate 110. On the same location but the opposite side of the base plate 110, another similar metal pad 112 is also attached as a hot-side thermal contact for conducting heat from a heat source for the thermoelectric unit 1000. Physically it also provides a way that can at least partially balance the stress within thickness of the base plate 110. Additionally, the second end region 102 of each TE leg 100 is bonded with a conducting, e.g., electrically conducting, shunt plate 120 near its four corner regions. Specifically, in one embodiment, the shunt plate 120 is designated for attaching a cold-side heat exchanger (from above, but not shown). For improving its flexibility and so as to partially relieve some thermal stress, in an illustrative embodiment the shunt plate 120 is made by a piece of metal foil or thin plate having an opened central window 121. Copper or other relatively good electrical and thermal conductor would be preferred choice of material for the shunt plate 120.

However, due to CTE difference between the TE leg material and the metal pad material as well as the base plate material, thermally induced mismatch stress within the TE leg can be relatively, or very, large. FIG. 2 shows an exemplary result of a 3D stress-level mapping throughout the two-pair TE unicouples (or a 4-leg unit) of FIG. 1, calculated using finite element analysis (FEA) using Solid-Works Simulation (Dassault Systemes SolidWorks Corporation, Waltham, Mass.). As shown, the thermally induced stress is quite large across the whole unit as indicated by relatively large (in the range of 240 MPa) and relatively unevenly distributed, e.g., near the junction region near the metal pad 111 and the first end region 101 of each TE leg 100. The result is obtained by assuming the base plate 110 with its bottom metal pad 112 attached to a hot-side heat source during a standard TE application. As the heat source temperature has been raised higher and higher in many desired applications, the thermal stress level could be even higher. For many desired TE applications, the hot-side temperature is above 600° C. which may cause substantial performance degradation or potential device failure. As shown in FIG. 2, the metal pad 111 below the first end region 101 of each TE leg 100 has larger expansion than the latter, causing uneven stress distribution especially at regions near four lower corner edges.

Figure 3:
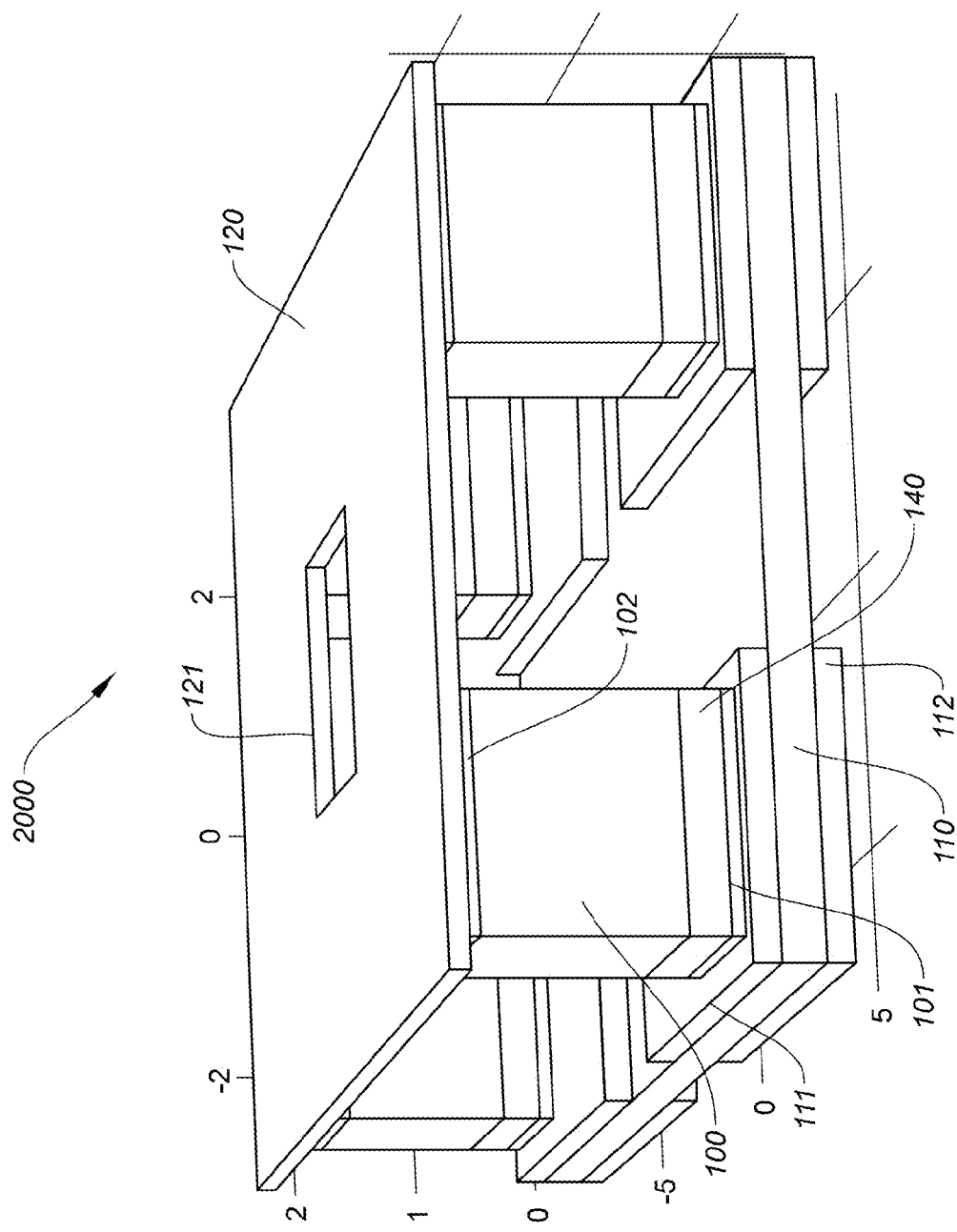
FIG. 3 illustrates a thermoelectric device package according to certain embodiments of the present invention.

As noted further above, some embodiments of the present invention provide thermoelectric devices having reduced thermal stress and contact resistance, and methods of forming and using the same. In an illustrative embodiment, a thermoelectric device can include a thermoelectric material that includes p-type or n-type material and first and second caps respectively including first and second cap materials respectively disposed on either side of the p-type or n-type material. The first and second cap materials each can respectively include an independently selected transition metal. For example, FIG. 3 is a schematic diagram of a pair of thermoelectric (TE) unicouples disposed on a base structure with an intermediate ductile cap inserted for each TE leg according to an embodiment of the present invention. This diagram is merely an example, which should not unduly limit the scope of the claims. One of ordinary skill in the art would recognize many variations, alternatives, and modifications. The figure is merely an example for one of several possible configurations.

In the illustrated embodiment as shown in FIG. 3, certain aspects of the TE unit 2000 are substantially similar to the TE unit 1000 except that a ductile cap 140 is inserted between the first end region of the TE leg 100 (e.g., a p-type or n-type material) and the metal pad 111 on the base plate 110. Another ductile cap 140 can be inserted between the second end region of the TE leg 100 and the metal pad 102 coupled to the shunt. In particular embodiments, the ductile cap(s) 140 independently are configured to be or to include a material or composite material that has a coefficient of thermal expansion (CTE) substantially matching with the TE material above, which can be a p-type or n-type material, so that the thermal induced CTE mismatch stress within the TE leg 100 is substantially reduced. The material(s) of the ductile cap(s) can be selected so as to respectively include a CTE that differs by 20% or less from a CTE of the TE material (e.g., p-type or n-type material), or by 10% or less from a CTE of the TE material, or by 5% or less from a CTE of the TE material, or by 2% or less from a CTE of the TE material, or by 1% or less from a CTE of the TE material. For example, the material(s) of the ductile cap(s) can be selected so as to respectively include a CTE that differs by 5 ppm/° C. or less from a CTE of the TE material (e.g., p-type or n-type material), or by 4 ppm/° C. or less from a CTE of the TE material, or by 3 ppm/° C. or less from a CTE of the TE material, or by 2 ppm/° C. or less from a CTE of the TE material, or by 1 ppm/° C. or less from a CTE of the TE material.

Exemplary TE materials (e.g., p-type or n-type material) suitable for use within TE unit 2000 include, but are not limited to, silicide-based (e.g., $Mn_xSi$, $Mg_2Si$, or $Mg_2SiSn$), skutterudites, bismuth tellurides, lead tellurides, tin tellurides, silicon germanium, zinc antimonide, tetrahedrite, TAGS (Te—Ag—Ge—Sb), Zintl, tin selenides, lanthanum tellurides, and the like. In one illustrative example, the p-type or n-type material can include magnesium silicide or manganese silicide. In another illustrative example, the p-type or n-type material can include tetrahedrite or $Mg_2SiSn$.

Depending on choice of the TE material for different TE application, a TE material with lower CTE (6-8 ppm/° C.) can be matched with cap(s), e.g., ductile cap(s), having similar CTE that is made from one or more materials selected from Kovar, Cr, Molybdenum, Ni—Fe alloy, Cu—Mo alloy, and the like. In certain embodiments, the one or more cap(s) materials are selected from Kovar, Cr, Molybdenum, 50/50 Ni—Fe alloy, and the like. In another example, a TE material with higher CTE (13-17 ppm/° C.) can be bonded with caps, e.g., ductile cap(s), having matched CTE made from one or more materials selected from Ni, Monel, Dura Nickel, Cu—Ni alloy, Cu—Mo alloy, Fe, and the like. In certain embodiments, the one or more caps(s) materials are selected from Ni, Monel, Dura Nickel, Cu—Ni 30, Cu—Ni 10, and the like. In one nonlimiting example, the p-type or n-type material includes magnesium silicide, and the cap(s) include nickel. In another nonlimiting example, the p-type or n-type material includes manganese silicide, and the cap(s) include chromium. Other combinations of materials suitable can be selected. The CTEs of various TE materials and materials suitable for use in cap(s) are known in the art or can be readily determined. Note that the caps(s) need not necessarily be formed of the same material as one another, and indeed can include independently selected materials that are different than one another. Additionally, in an illustrative embodiment, the materials of the cap(s) do not include a silicide.

In an exemplary embodiment, the ductile cap(s) 140 each can be or can include a separate piece of composite material by sintering several above selected materials, which also provides an enhanced bonding strength between the TE leg and the metal pad below as those materials within the ductile cap(s) provide elements for facilitating metal brazing process. Particularly, the bonding strength at the hot-side junction is retained during those designated high-temperature operation environment. Alternatively, the ductile cap(s) 140 can be added directly to the first end region of the TE leg as part of the formation process to fabricate each TE leg 100 by sintering process. In other words, the ductile cap(s) 140 can become part of the TE leg 100.

During any TE operation, the intermediate cap(s), e.g., ductile metal caps, can or will deform to accommodate CTE mismatch between the ceramic base plate and TE leg. Especially near the hot-side junction, the thermal expansion can be the greatest for each TE leg. Similarly, near the cold-side junction, the thermally induced mismatch stress between the TE leg and the shunt plate also can exist. As mentioned further above, another CTE matching metal cap can be inserted between the second end region of the TE leg and the shunt material or co-sintered with TE material on the second end region of each TE leg during the TE leg formation process. As a result, a thermoelectric package with p-type and n-type materials with same and different CTEs can be mounted on the same base plate or shunt substantially without inducing thermal stresses from CTE mismatch in the legs.

Figure 4A:
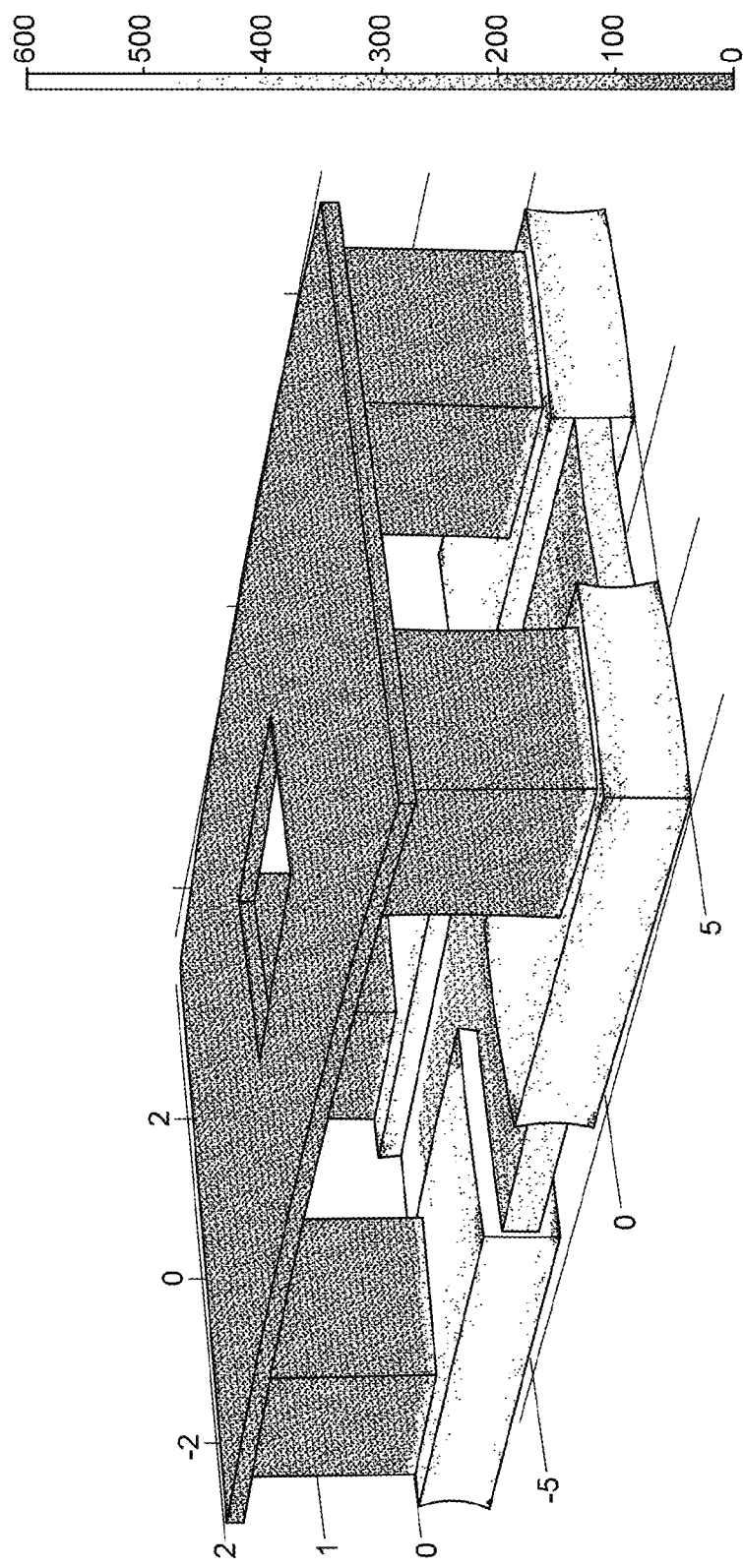
FIGS. 4A-4D illustrates results of an exemplary 3D stress mapping calculation performed on illustrative configurations of the thermoelectric device package of FIG. 3, according to certain embodiments of the present invention.
Figure 4B:
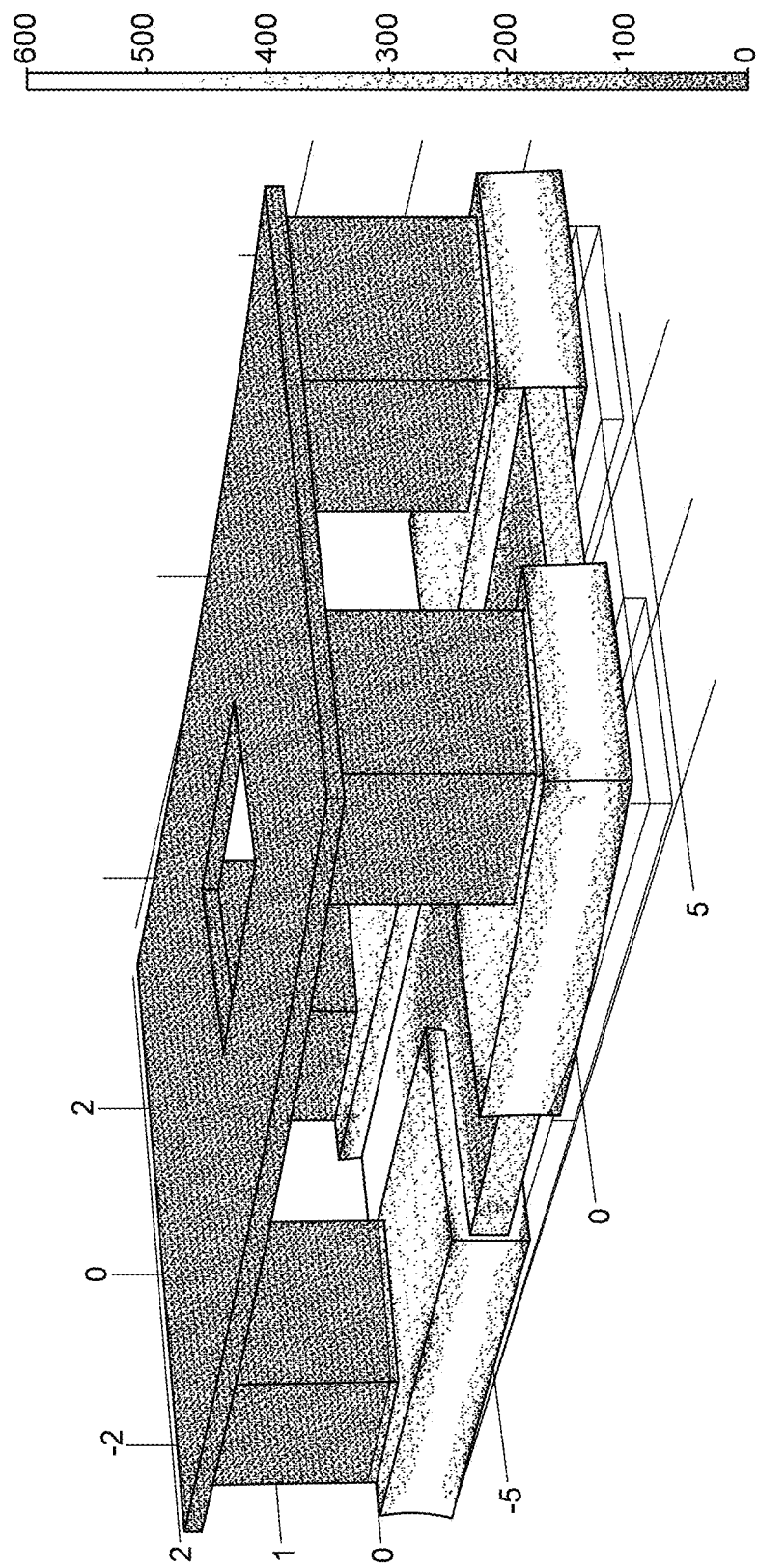
Figure 4C:
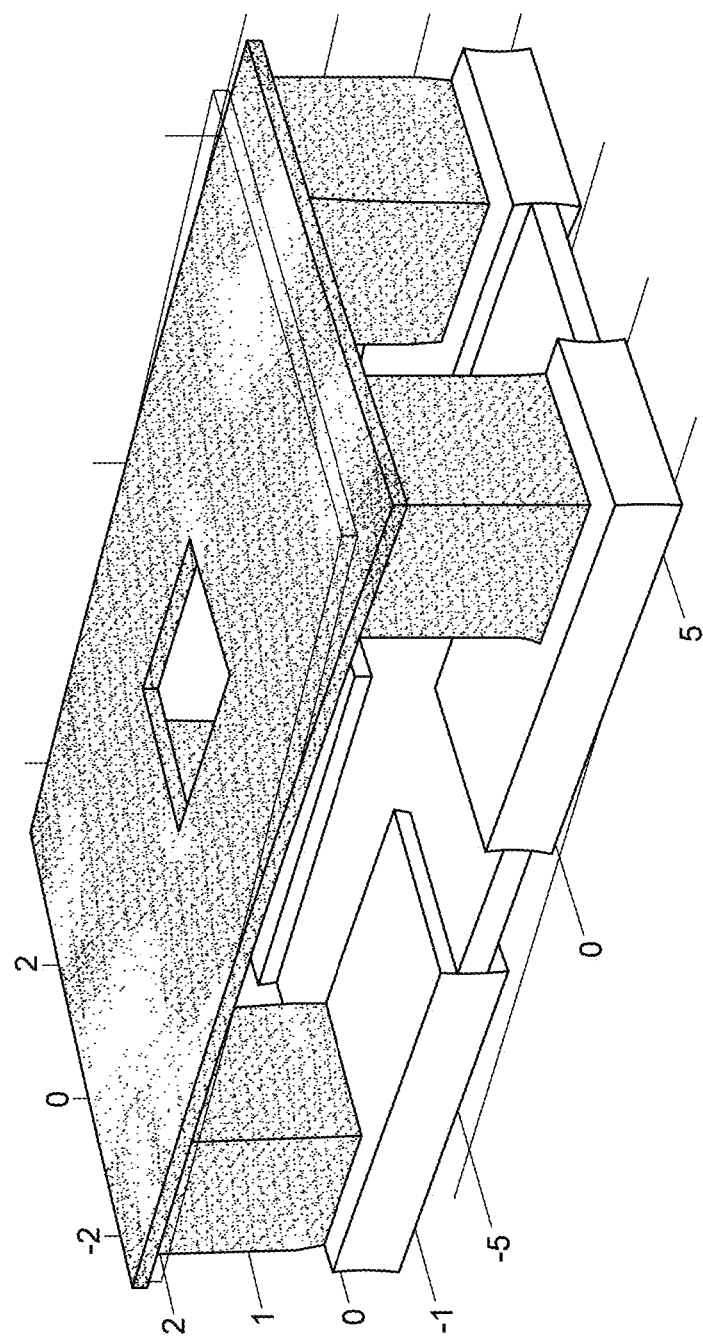
Figure 4D:
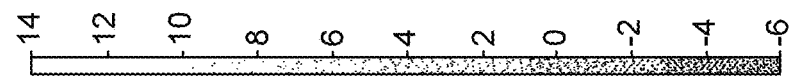
Figure 4D:
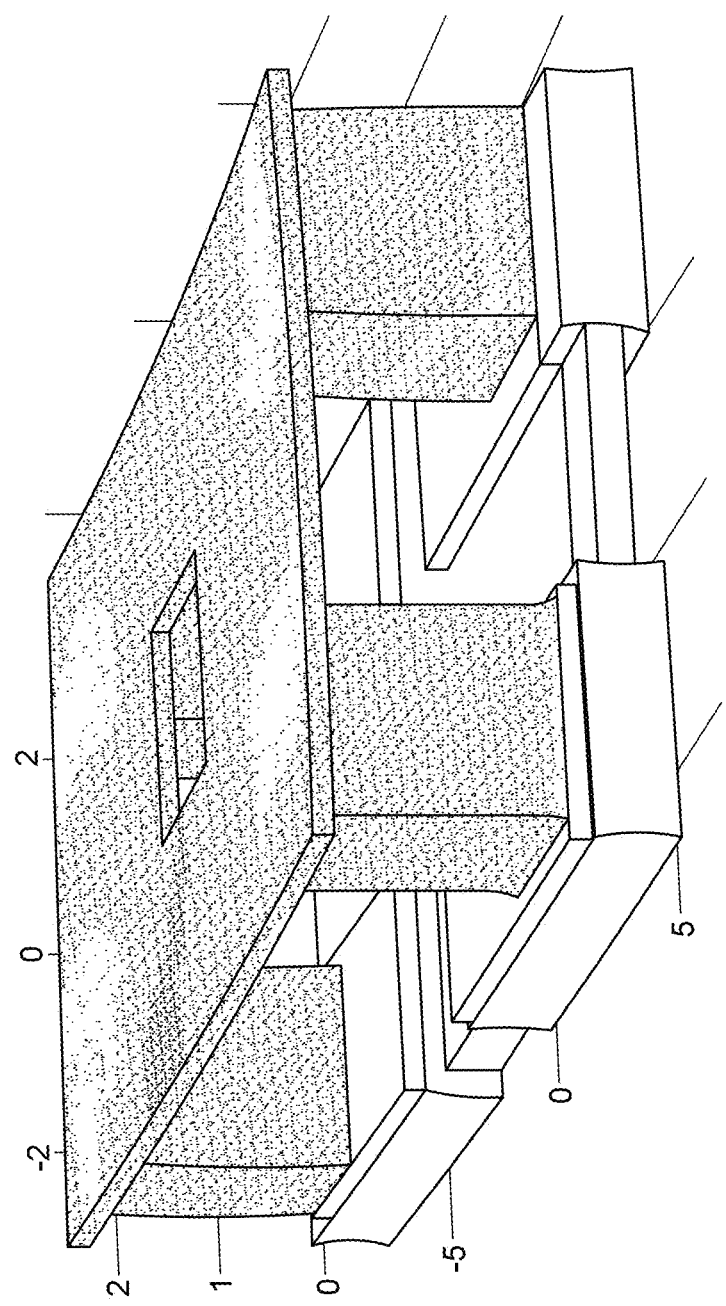

FIGS. 4A-4D illustrate results of an exemplary 3D stress mapping calculation performed on illustrative configurations of the thermoelectric device package of FIG. 3, according to certain embodiments of the present invention. These diagrams are merely examples, which should not unduly limit the scope of the claims. One of ordinary skill in the art would recognize many variations, alternatives, and modifications. For example, FIG. 4D shows an exemplary result of 3D stress-level mapping throughout the two-pair TE unicouples (or a O-leg unit) after introducing a ductile cap 140 inserted between the first end region of the TE leg 100 (e.g., a p-type or n-type material) and the metal pad 111 on the base plate 110 for each TE leg shown in FIG. 3. The stress mapping data is taken for a 4-leg unit of FIG. 3 with inserted metal cap for each TE leg and the whole unit being held at the substantially the same operation environment applied to the 4-leg unit shown in FIG. 2. As shown, the thermally induced stress now is much smaller across the whole unit as indicated by more than 10 folds lower von Mises stress, and Gauss-point evaluation in the 16 MPa range when compared with that in FIG. 2 for the unit without any specific CTE matching. The stress distribution is also much more even through the length of the TE leg and near the junction region near the metal pad 111 and the first end region 101. The relatively high stress level originally appeared in four lower corner edges as shown in FIG. 2 now is negligible, almost disappears.

Note that in some embodiments, the ductile cap 140 can be made with a slightly bigger base area in contact with the metal pad below than that near the first end region of each TE leg. During the operation, the ductile cap is allowed to expand more near the metal pad but substantially without causing significant stresses to the upper region in contact with the TE leg, thereby reducing the mismatching stress in the TE leg. As shown in the top region with shunt plate in FIG. 4D, although somewhat larger stress would appear to be illustrated, note that this is merely due to the whole scale of the measurement is reduced by more than 10 fold relative to that in FIG. 2 so that the sensitivity in FIG. 4D is higher. On other hand, the flexible shunt plate indeed plays its role to help reducing the stress in the TE leg induced from CTE mismatch from the cold-side junction during operation.

In an embodiment, the presence of a cap, e.g., a ductile metal cap, on the cold side of a thermoelectric material can or will increase the reliability of solder joint (for bonding the shunt plate with the TE legs) by reducing the stresses induced in the joint. In another embodiment, the presence of one or more caps, e.g., ductile metal caps, each with Ti/Ni metallization can or will provide increased bond strength and improved adhesion during co-sintering process of the CTE matching material with the TE materials. This may also provide increased leg material strength during a dicing process from a bigger sintered bulk of TE material to produce each individual TE leg. In yet another embodiment, a co-sintering process to form a TE leg with CTE matching end cap in one step can reduce the total number of processes for fabricating and packaging a thermoelectric device. This allows elimination of one or more metallization process for forming TE legs, therefore reducing cost by simplifying manufacturing process of the thermoelectric devices. Of course, there are many other variations, alternatives, and modifications. Exemplary methods for forming TE materials using sintering are described below with reference to FIG. 8, and exemplary methods of forming thermoelectric devices are described further below with reference to FIG. 6.

In another embodiment, a method for thermal stress and coefficient of thermal expansion (CTE) mismatch management in thermoelectric package is provided. Reduction of thermal stresses in thermoelectric legs during their manufacturing process and thermoelectric operation can be provided by using one or more CTE matching materials, e.g., ductile materials, at the interface between the thermoelectric materials and an electrical connector, e.g., shunt material, which can be disposed on or in contact with a ceramic base plate. Exemplary advantages of implementing certain embodiments of the present invention can include reducing or minimizing thermal stresses, increasing bond strength between TE material and package, and reducing manufacture cost of thermoelectric package by simplifying packaging steps and facilitating brazing steps.

Thermoelectric device 2000 illustrated in FIG. 3 can be configured to pump heat from shunt plate 120 to base plate 110 through thermoelectric legs 100 based on a voltage applied between those thermoelectric legs via respective metal pads 111. As such, thermoelectric device 2000 can be used to cool shunt plate 120 or a body coupled thereto and to heat base plate 110 or a body coupled thereto, or to heat shunt plate 120 or a body coupled thereto and to cool base plate 110 or a body coupled thereto. For example, the second end region 102 of each thermoelectric leg 100 can be in thermal and electrical contact with shunt plate 120 from which heat is to be pumped, and the first end region 101 of each thermoelectric leg 100 can be in thermal and electrical contact with base plate 110 to which heat is to be pumped. Accordingly, one or more of thermoelectric legs 100 can be configured electrically in series with one another, and thermally in parallel with one another between shunt plate 120 from which heat is to be pumped, and base plate 110 to which heat is to be pumped. Thermoelectric legs 100 each can include a p-type or n-type material and first and second caps disposed on either side of the p-type or n-type material using any suitable configuration or method provided herein. The thermoelectric legs 100 of device 2000 need not necessarily include the same p-type or n-type material as one another. For example, two of the thermoelectric legs 100 of device 2000 can include a p-type material, e.g., $Mg_2Si$, and two of the thermoelectric legs 100 of device 2000 can include an n-type material, e.g., $MnSi_x$.

A first metal pad 111 of a thermoelectric leg 100 including an n-type material can be coupled to any suitable electrical component, and a second metal pad 111 of a thermoelectric leg 100 including a p-type material also can be coupled to that electrical component. Responsive to a temperature differential or gradient between shunt plate 120 and base plate 110, electrons (e−) flow from the shunt plate 120 to the first metal pad 111 through the n-type material, and holes (h+) flow from the shunt plate to the second metal pad 111 through the p-type material, thus generating a current. An electrical potential or voltage between the first and second metal pads 111 is created by having each thermoelectric leg 100 in a temperature gradient with electric current flow created as the p-type and n-type materials are connected together electrically in series and thermally in parallel. The current generated by device 2000 can be utilized in any suitable manner. For example, the first metal pad 111 can be coupled to an anode 28 via a suitable connection, e.g., an electrical conductor, and the second metal pad 111 can be coupled to a cathode via a suitable connection, e.g., an electrical conductor. The anode and cathode can be connected to any suitable electrical device so as to provide a voltage potential or current to such device. Exemplary electrical devices include batteries, capacitors, motors, resistors, and the like. For example, the anode and cathode respectively can be coupled to first and second terminals of a resistor. The resistor can be a stand-alone device or can be a portion of another electrical device to which the anode and cathode can be coupled. Alternatively, the first metal pad 111 can be coupled to the cathode of a battery or other power supply, and the second metal pad 111 can be coupled to the anode of that battery or other power supply, and responsive to a voltage applied by the battery or other power supply between the first and second metal pads, electrons (e−) flow from shunt plate 120 to the first metal pad 111 through the n-type material, and holes (h+) flow from shunt plate 120 to the second metal pad 111 through the p-type material, thus pumping heat from shunt plate 120 to base plate 110. The pumping of heat from shunt plate 120 to base plate 110 suitably can be used to cool shunt plate 120. For example, shunt plate 120 can be coupled to a computer chip or other electrical component that can benefit from thermoelectric cooling.

As noted further above, FIGS. 4A-4D respectively show exemplary results of 3D stress-level mapping for different configurations of structure 2000 illustrated in FIG. 3. More specifically, FIGS. 4A-4D show an FEA analysis respective for four different multi-leg TE packages including two kinds of TE legs without metal caps and two other kinds of TE legs with metal caps according to embodiments of the present invention. The results show the benefit of reduced thermally-induced stress from the use of metal caps, with either a silicon nitride or alumina substrate, when compared to the thermally-induced stress of TE legs that do not have metal caps. The thermal stress is reduced from 600 MPa to 16 MPa. In illustrative embodiments, the CTE of the metal caps can either be an intermediate value between that of the TE material and that of shunt material to have a gradual change in CTE difference or is closely matched to the TE material, such that the thermal stress is mostly sustained by the strong metal cap rather than imposed onto the weak TE leg. Exemplary parameters used in preparing FIGS. 4A-4D, and exemplary results of FIGS. 4A-4D, are summarized in Table 1.

TABLE 1

Exemplary Parameters and Results

| Parameter | FIG. 4A | FIG. 4B | FIG. 4C | FIG. 4D |
| --- | --- | --- | --- | --- |
| Design configuration | Base case (silicon nitride base plate, no metal caps) | Alumina base plate (no metal caps) | Silicon nitride base plate and TE legs with metal caps | Alumina base plate and TE legs with metal caps |
| Base plate material | Silicon nitride | Alumina | Silicon nitride | Alumina |
| Hot side bonding material | Incusil ABA (brazing) | Incusil ABA (brazing) | Incusil ABA (brazing) | Incusil ABA (brazing) |
| TE material for n-type leg | Magnesium silicide | Magnesium silicide | Magnesium silicide | Magnesium silicide |
| Cap material for n-type leg | N/A | N/A | Nickel | Nickel |
| TE material for p-type leg | Manganese silicide | Manganese silicide | Manganese silicide | Manganese silicide |
| Cap material for p-type leg | N/A | N/A | Chromium | Chromium |
| Cold side bonding material | 94Sn—4Ag (solder) | 94Sn—4Ag (solder) | 94Sn—4Ag (solder) | 94Sn—4Ag (solder) |
| Lead frame (metal cold-side structure with tabs that can be removed) | Copper | Copper | Copper | Copper |
| Hot side temperature (boundary condition) | 388° C. | 388° C. | 388° C. | 388° C. |
| Cold side temperature (boundary condition) | 172° C. | 172° C. | 172° C. | 172° C. |
| Fixed constraint | Shorter edge of base plate | Shorter edge of base plate | Shorter edge of base plate | Shorter edge of base plate |
| Model used for hot side bonding material | Elasto-plastic | Elasto-plastic | Elasto-plastic | Elasto-plastic |
| Model used for cold side bonding material | Viscoplastic | Viscoplastic | Viscoplastic | Viscoplastic |
| Maximum Von Mises Stress (Exemplary Result) | 600 MPa | 600 MPa | 16 MPa | 16 MPa |

In another embodiment, the present invention provides a composite structure of a bulk-size thermoelectric material sandwiched by two relatively thick cap layers, e.g., metal layers. In a specific embodiment, the sandwich composite structure is, or includes, at least a portion of a pellet made by co-sintering powdered thermoelectric material and powdered cap material(s), e.g., metal material(s). However, it should be appreciated that such sandwich composite structures can be formed using other suitable methods.

In some embodiments, the thickness of the TE material can be approximately 0.5 mm to approximately 20 mm. For example, the thickness of the TE material can be approximately 1 mm to approximately 10 mm. Or, for example, the thickness of the TE material can be approximately 2 mm to approximately 5 mm. Or, for example, the thickness of the TE material can be approximately 2 mm to approximately 5 mm. Or, for example, the thickness of the TE material can be approximately 2 mm to approximately 3 mm. Additionally, or alternatively, the thickness of each cap can be greater than approximately 0.2 mm. For example, the thickness of each cap can be greater than approximately 0.3 mm. Or, for example, the thickness of each cap can be approximately 0.2 mm to approximately 2 mm. Or, for example, the thickness of each cap can be approximately 1 mm to approximately 2 mm. Or, for example, the thickness of each cap can be approximately 0.5 mm to approximately 1.5 mm. For example, the thickness of each cap can be greater than approximately 2 mm. Additionally, or alternatively, the thickness of the p-type or n-type material can be approximately 0.2 mm to approximately 5 mm. For example, the thickness of the p-type or n-type material can be approximately 0.5 mm to approximately 4 mm. Or, for example, the thickness of the p-type or n-type material can be approximately 0.5 mm to approximately 2.5 mm. Or, for example, the thickness of the p-type or n-type material can be approximately 0.5 mm to approximately 2 mm. As used herein, the terms "about" and "approximately" are intended to mean within plus or minus 10% of the stated value.

Figure 5A:
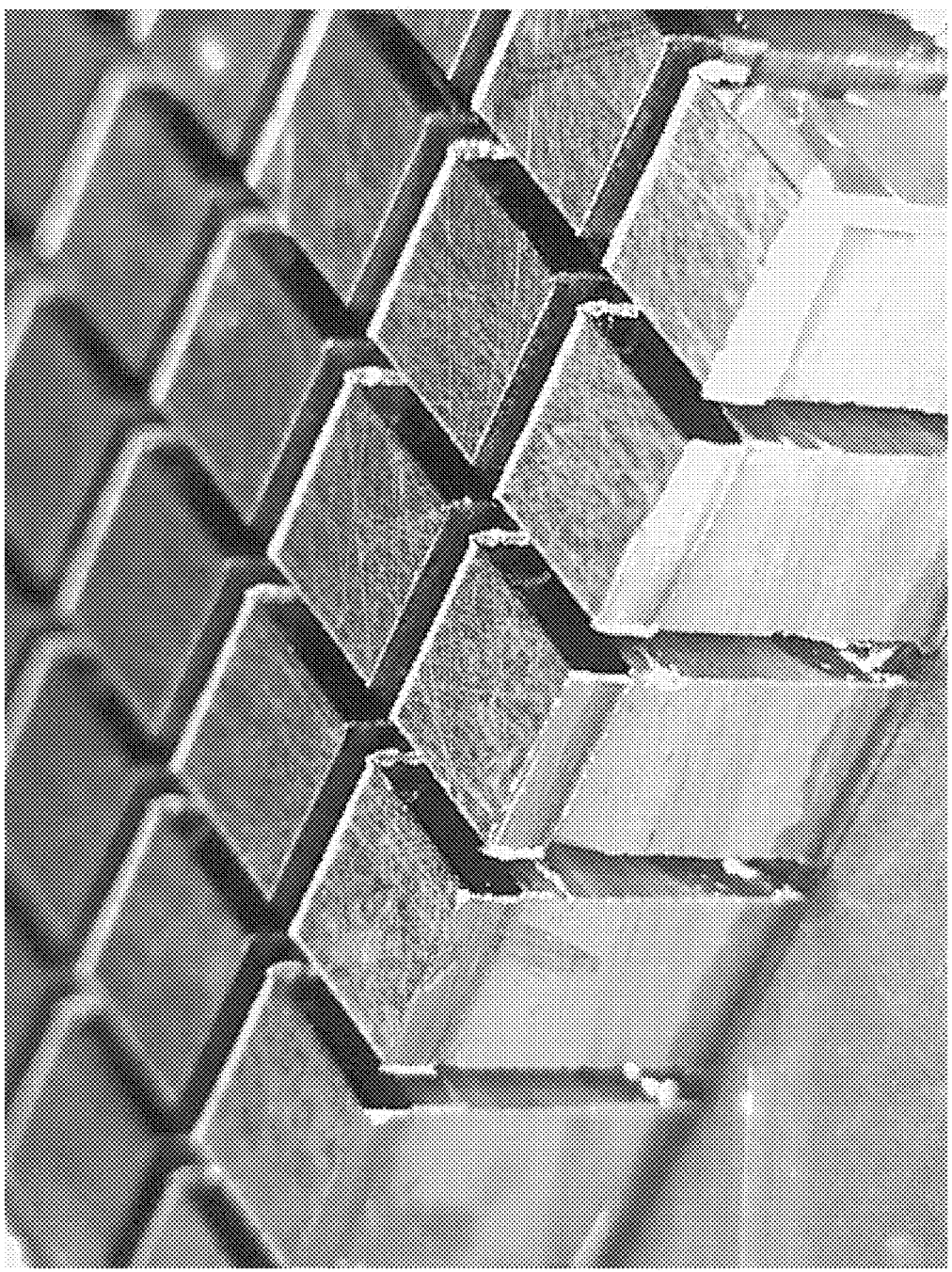
FIGS. 5A-5B are photographic images of thermoelectric legs according to certain embodiments of the present invention.
Figure 5B:
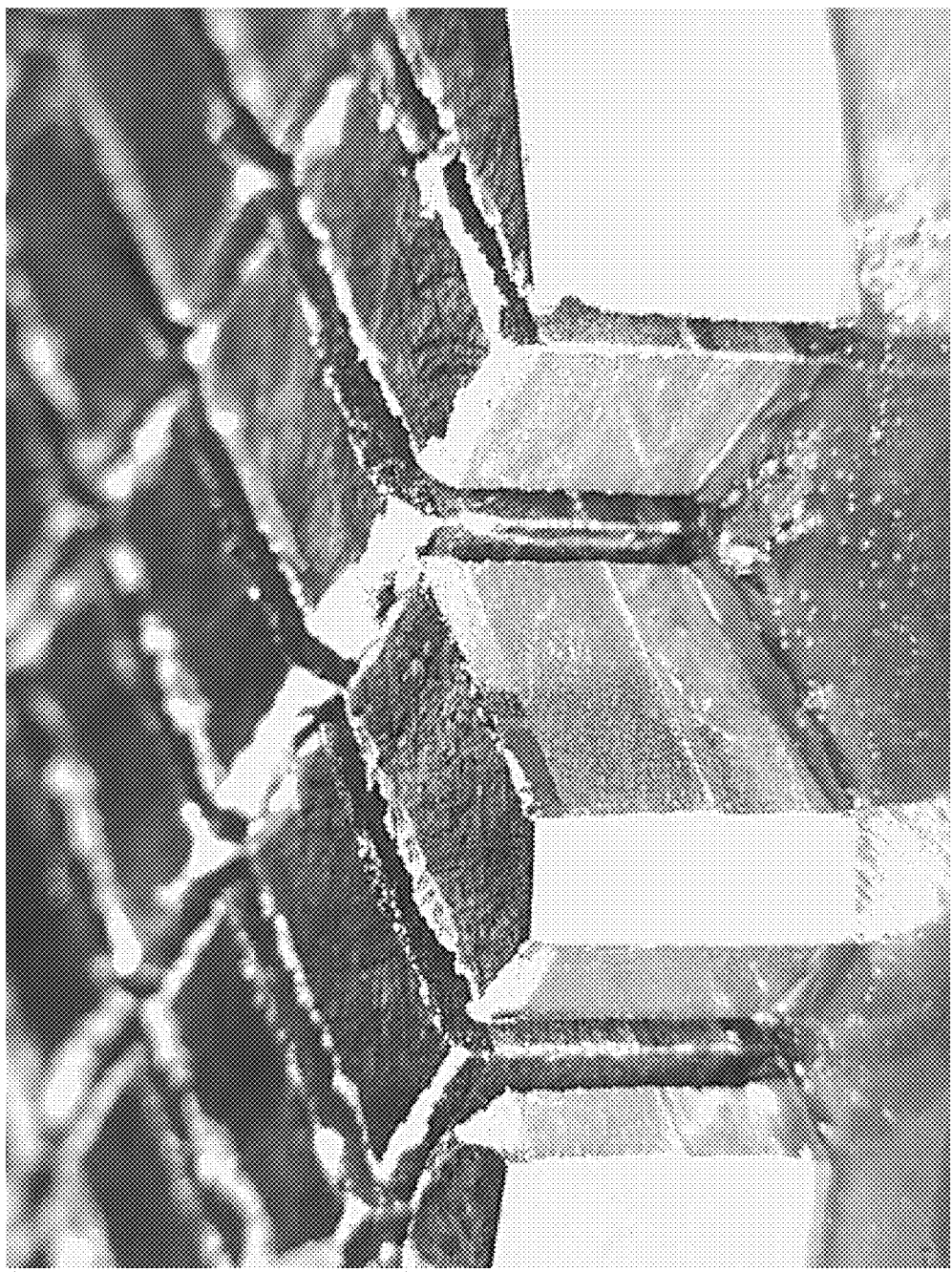

As illustrative examples, FIG. 5A and FIG. 5B are exemplary images of co-sintered bulk thermoelectric composite sandwich materials (which also may be referred to as "pellets") that have been diced into multiple pieces according to embodiments of the present invention. These diagrams are merely examples, which should not unduly limit the scope of the claims. One of ordinary skill in the art would recognize many variations, alternatives, and modifications. In FIG. 5A, on the left, the central material is magnesium silicide ($Mg_2Si$), while the materials at top and bottom are nickel caps. In FIG. 5B, on the right, the middle silver-color material is manganese silicide ($MnSi_{1.73}$), while the top and bottom layers are chromium caps. The top area on both samples includes a thin film of gold deposited after sintering. In an embodiment, as shown in FIGS. 5A and 5B, the pellet formed from the co-sintering process includes two metal caps that have been polished to reduce the thickness to about 0.3 mm from initial thickness of about 1-1.25 mm and the thermoelectric material in the middle region remains to be the original thickness of about 2.5-3.0 mm. There can be about 10% variation in those thickness values for a random just-sintered pellet. Pellets can be polished to reduce the metal cap thickness to specification, as well as to achieve planar parallel surfaces, before dicing into individual thermoelectric legs with an exemplary base of 2 mm×2 mm square, though other shapes and sizes are possible, e.g., pellets or diced thermoelectric legs with a cross-sectional area in the range of approximately 1.8 mm×1.8 mm to approximately 3.6 mm×1.8 mm. Exemplary methods for forming TE materials using sintering are described below with reference to FIG. 8, and exemplary methods of forming thermoelectric devices are described further below with reference to FIG. 6.

In one illustrative embodiment, when making the cap, e.g., metal cap, using the co-sintering method of the present invention, adding metal powder material to above 1 mm in thickness facilitates formation of a flat surface in a pre-pressing step such that the flat surface is substantially not slanted and has full or substantially full coverage of the underneath material. Without wishing to be bound by any theory, it is believed that this feature further can lead to an improved metal-thermoelectric interface structure formed during the co-sintering process that is useful, or potentially even crucial, for the formation of bulk thermoelectric composite sandwich structure substantially free from cracking and free from delamination of the metal cap from the sintered thermoelectric layer during the formation of individual legs by dicing.

Another manifestation of certain embodiments of the present invention is to use a thin metal layer in between two thicker layers of thermoelectric material to bond them together using the co-sintering process, allowing formation of a thicker bulk thermoelectric. Yet another embodiment is to use a very thin metal cap as a conductive interface for brazing together with conductive shunts.

Another optional process that could be used in place of a spark-plasma sintering (SPS) based sintering method such as described further herein is hot pressing wherein the high temperature is achieved with induction or indirect resistance heating while pressure applied to the sample can be much higher than that used in SPS sintering. Depending on the material selection for the thermoelectric powder material and metal powder material, the specific process condition may be different.

As noted further above, many benefits are provided upon the application of various embodiments of the present invention. One of them is the ability to control thermoelectric property variations out of the sintered thermoelectric composite material. Formation of bulk thermoelectric composite materials using many methods, including the co-sintering process described in certain embodiments of the present invention, often yields properties that vary with pellet size due to defects, agglomerates, presence of various material phases, variations of component concentrations, and other stochastic phenomena. Such property variations can cause nontrivial variation among many small legs that are cut from a single pellet formed after co-sintering process, resulting in deviation of properties from the design point. As a result of the thermoelectric material variation, while pellet-level measurements show that electrical resistance of all the diced legs would be expected to fall between 2 and 10 mOhm, the measurement data showed that resistance for individual legs ranged from 2 to well over 20 mOhm, with outliers even at one order of magnitude higher. In some embodiments, the diced legs characterized by an electrical resistance between 2 and 10 mOhm can include a cross-sectional area in the range of approximately 1.8 mm×1.8 mm and approximately 3.6 mm×1.8 mm and a thickness of the p-type or n-type material in the range of approximately 0.5 mm to approximately 2 mm. It should be appreciated that other suitable ranges of cross-sectional area and other thicknesses of p-type or n-type materials can be selected so as to provide thermoelectric materials or diced legs characterized by an electrical resistance between 2 and 10 mOhm.

Figure 6:
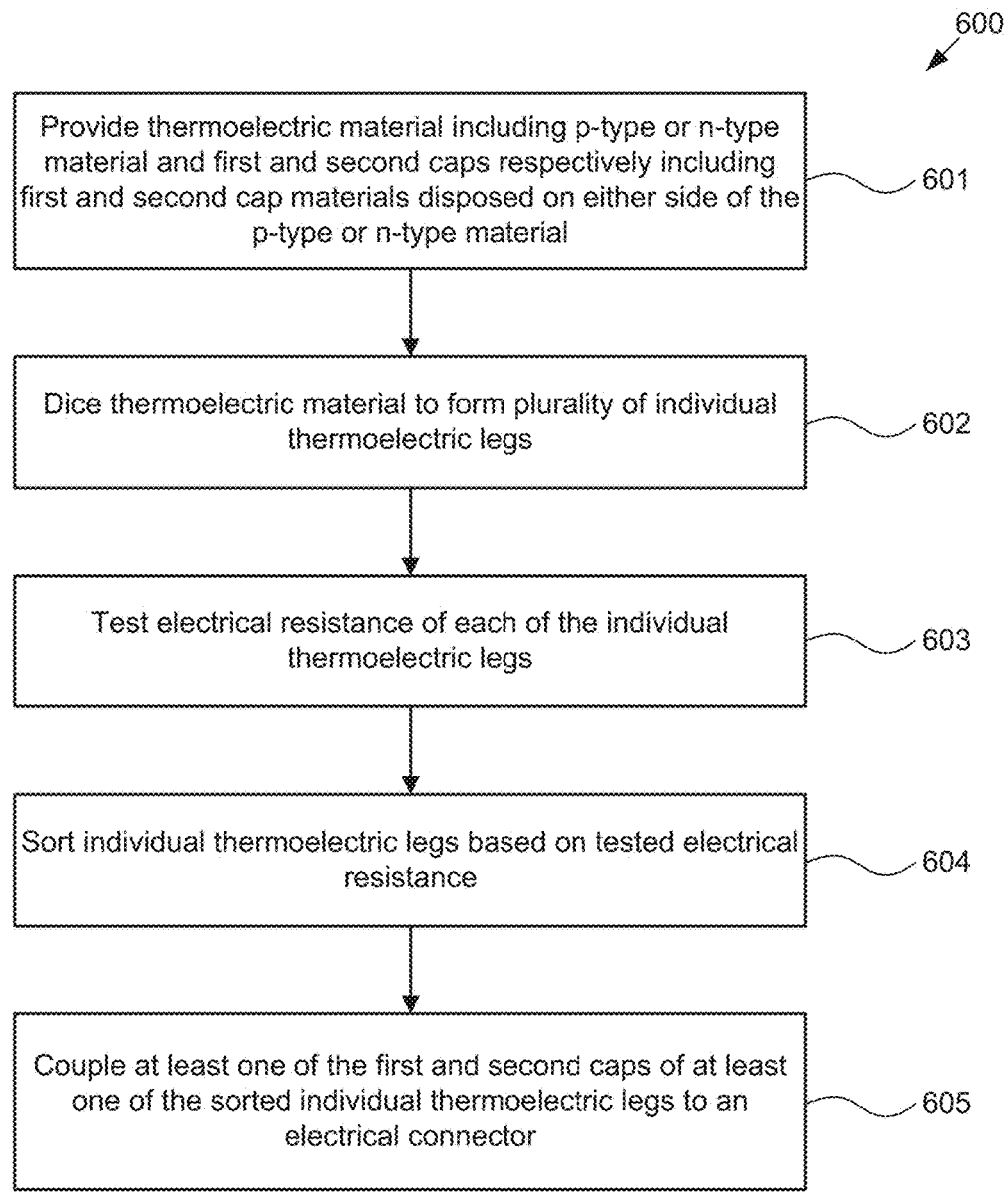
FIG. 6 illustrates steps in an exemplary method for forming a thermoelectric device according to certain embodiments of the present invention.

FIG. 6 illustrates steps in an exemplary method for forming a thermoelectric device according to certain embodiments of the present invention. This diagram is merely an example, which should not unduly limit the scope of the claims. One of ordinary skill in the art would recognize many variations, alternatives, and modifications. For example, as illustrated in method 600 of FIG. 6 a thermoelectric material can be provided that includes a p-type or n-type material and first and second caps respectively including first and second cap materials respectively disposed on either side of the p-type or n-type material (601). Exemplary, nonlimiting materials suitable for use in such p-type or n-type materials or in such first and second cap materials are described elsewhere herein. Additionally, exemplary, nonlimiting methods for forming such thermoelectric materials are described further herein, e.g., with reference to FIG. 8. In certain embodiments, the first and second cap materials each can respectively include an independently selected transition metal, and a thickness of each of the first and second caps can be approximately 0.2 mm to approximately 2 mm, although other thicknesses mentioned herein suitably can be used. The thermoelectric material can be diced to form a plurality of individual thermoelectric legs (602). Methods of dicing thermoelectric materials are known in the art, and include wire saw, blade dicing, or any standard process used in the semiconductor industry. The electrical resistance, or any other appropriate thermal, mechanical, or electrical characteristic, of each of the individual thermoelectric legs can be tested (603). Exemplary thermal characteristics that can be tested include thermal resistance. Exemplary electrical characteristics that can be tested include electrical resistance and electrical power. The individual thermoelectric legs can be sorted based on the tested electrical resistance or other characteristic (604). In one nonlimiting example, each individual leg can be sorted based on whether the measured electrical resistance or other characteristic varies from the target value by 10% or less, or by 10-20%, or by 20-30%, or by 30-40%, or by 40-50%, or by greater than 50%, and so on. Any suitable criterion can be used to sort the individual thermoelectric legs. At least one of the first and second caps of at least one of the sorted individual thermoelectric legs can be coupled to an electrical connector (605). For example, a given thermoelectric leg may meet an electrical resistance criterion for use in a particular application, and thus can be coupled to an electrical connector in accordance with that application.

Figure 7:
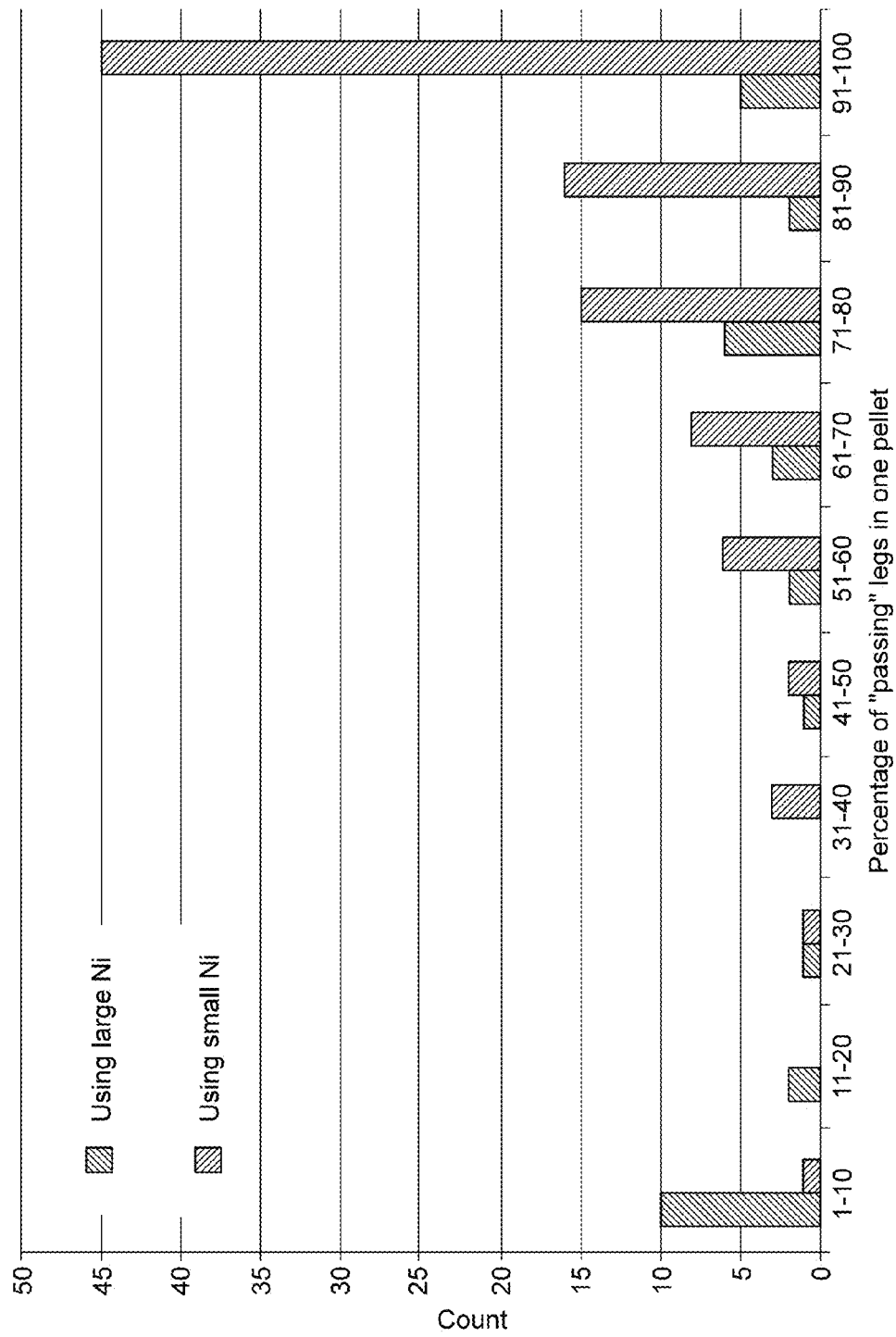
FIG. 7 is a plot illustrating the number of useful thermoelectric legs formed by dicing a thermoelectric material according to certain embodiments of the present invention.

FIG. 7 is a plot illustrating the number of useful thermoelectric legs formed by dicing a thermoelectric material according to certain embodiments of the present invention. This diagram is merely an example, which should not unduly limit the scope of the claims. One of ordinary skill in the art would recognize many variations, alternatives, and modifications. For example, FIG. 7 shows the percentage of the diced legs from over 160 pellets that were deemed to "pass" the resistance criterion, even though the pellets themselves prior to dicing all pass the manufacturing specification for resistance. The resistance criterion was an electrical resistance of 2-10 mOhm. In this example, the diced legs had a cross-sectional area of approximately 1.8 mm by 1.8 mm. The caps included nickel, and the thicknesses of the caps varied between about 500 μm and about 2 mm. The thermoelectric material included $Mg_2Si$, and the thickness of the thermoelectric material varied between about 1.5 and 2.5 mm. The average particle size of $Mg_2Si$ powder used to prepare the pellets was not specifically measured, but was believed to be in the range of approximately 1 μm and 10 μm. Spark plasma sintering (SPS) was used to prepare the pellets in a manner consistent with that described below with reference to FIG. 8, and a wire saw was used to dice the pellets. A homemade system was used to measure resistance, that included Kelvin probes and a Keithley nanovoltmeter and current source. As used herein, "average particle size" is intended to mean at least one of the arithmetic mean of the particle sizes, the median particle size, or the mode of the particle size. Illustratively, "average particle size" can mean the median particle size.

Note that pellets that were otherwise the same but formed using two different average particle sizes of nickel powder were used to prepare diced legs that were measured in association with FIG. 7. More specifically, a first set of legs referred to in FIG. 7 as "Using large Ni" were prepared by dicing pellets of a thermoelectric material including first and second caps formed using nickel powder having, or being characterized by, an average particle size of 150 μm. A second set of legs referred to in FIG. 7 as "Using small Ni" were prepared by dicing pellets of a thermoelectric material including first and second caps formed using commercially purchased nickel powder having, or being characterized by, an average particle size of 5 μm or less. It readily can be understood from FIG. 7 that the percentage of passing legs in one pellet was found to be significantly higher for pellets formed using the nickel powder having, or being characterized by, an average particle size of 5 μm or less, as compared to pellets formed nickel powder having, or being characterized by, an average particle size of 150 μm. For example, the data on the far right of FIG. 7 indicate that about 45 pellets formed using the nickel powder having, or being characterized by, an average particle size of 5 μm or less each yielded 91% to 100% of thermoelectric legs that met the resistance criterion diced from those pellets, and that about 5 pellets formed using the nickel powder having, or being characterized by, an average particle size of 150 μm each yielded 91% to 100% of thermoelectric legs that met the resistance criterion diced from those pellets.

Moving leftward across FIG. 7, about 16 pellets formed using the nickel powder having, or being characterized by, an average particle size of 5 μm or less each yielded 81% to 90% of thermoelectric legs that met the resistance criterion diced from those pellets, and that about 2 pellets formed using the nickel powder having, or being characterized by, an average particle size of 150 μm each yielded 81% to 90% of thermoelectric legs that met the resistance criterion diced from those pellets. Continuing to move leftward across FIG. 7, about 15 pellets formed using the nickel powder having, or being characterized by, an average particle size of 5 μm or less each yielded 71% to 80% of thermoelectric legs that met the resistance criterion diced from those pellets, and that about 6 pellets formed using the nickel powder having, or being characterized by, an average particle size of 150 μm each yielded 71% to 80% of thermoelectric legs that met the resistance criterion diced from those pellets. Continuing to move leftward across FIG. 7, about 8 pellets formed using the nickel powder having, or being characterized by, an average particle size of 5 μm or less each yielded 61% to 70% of thermoelectric legs that met the resistance criterion diced from those pellets, and that about 3 pellets formed using the nickel powder having, or being characterized by, an average particle size of 150 μm each yielded 61% to 70% of thermoelectric legs that met the resistance criterion diced from those pellets. Continuing to move leftward across FIG. 7, about 6 pellets formed using the nickel powder having, or being characterized by, an average particle size of 5 μm or less each yielded 51% to 60% of thermoelectric legs that met the resistance criterion diced from those pellets, and that about 2 pellets formed using the nickel powder having, or being characterized by, an average particle size of 150 μm each yielded 61% to 70% of thermoelectric legs that met the resistance criterion diced from those pellets. Continuing to move leftward across FIG. 7, about 2 pellets formed using the nickel powder having, or being characterized by, an average particle size of 5 μm or less each yielded 41% to 50% of thermoelectric legs that met the resistance criterion diced from those pellets, and that about 1 pellet formed using the nickel powder having, or being characterized by, an average particle size of 150 μm yielded 41% to 50% of thermoelectric legs that met the resistance criterion diced from those pellets. Continuing to move leftward across FIG. 7, about 4 pellets formed using the nickel powder having, or being characterized by, an average particle size of 5 μm or less each yielded 31% to 40% of thermoelectric legs that met the resistance criterion diced from those pellets, and that about 0 pellets formed using the nickel powder having, or being characterized by, an average particle size of 150 μm each yielded 31% to 40% of thermoelectric legs that met the resistance criterion diced from those pellets. Continuing to move leftward across FIG. 7, about 1 pellet formed using the nickel powder having, or being characterized by, an average particle size of 5 μm or less yielded 21% to 30% of thermoelectric legs that met the resistance criterion diced from those pellets, and that about 1 pellet formed using the nickel powder having, or being characterized by, an average particle size of 150 μm yielded 21% to 30% of thermoelectric legs that met the resistance criterion diced from those pellets. Continuing to move leftward across FIG. 7, about 0 pellets formed using the nickel powder having, or being characterized by, an average particle size of 5 μm or less each yielded 11% to 20% of thermoelectric legs that met the resistance criterion diced from those pellets, and that about 2 pellets formed using the nickel powder having, or being characterized by, an average particle size of 150 μm each yielded 11% to 20% of thermoelectric legs that met the resistance criterion diced from those pellets. The data on the far left of FIG. 7 indicate that about 1 pellet formed using the nickel powder having, or being characterized by, an average particle size of 5 μm or less yielded 1% to 10% of thermoelectric legs that met the resistance criterion diced from those pellets, and that about 10 pellets formed using the nickel powder having, or being characterized by, an average particle size of 150 μm each yielded 1% to 10% of thermoelectric legs that met the resistance criterion diced from those pellets.

Accordingly, without wishing to be bound by any theory, it is believed that forming caps using precursor particle sizes that are relatively small, or relatively similar to the particle sizes of precursor particles for the p-type or n-type material, can significantly improve the percentage of thermoelectric legs that met the resistance criterion diced from pellets formed using those particles. For example, a thermoelectric device can include a thermoelectric material formed by co-sintering a powder precursor of a first cap material, a powder precursor of a p-type or n-type material, and a powder precursor of a second cap material in a sintering die, wherein a particle size ratio of the powder precursor of the p-type or n-type material to the powder precursors of the first and second cap materials can be in the range of approximately 50:1 to approximately 1:50, or approximately 50:1 to 1:1, or approximately 1:50 to 1:1. For example, a particle size ratio of the powder precursor of the p-type or n-type material to the powder precursors of the first and second cap materials can be in the range of approximately 20:1 to approximately 1:20, e.g., can be approximately 1:20, or can be in the range of approximately 10:1 to approximately 1:10, or can be in the range of approximately 5:1 to approximately 1:5, or can be in the range of approximately 4.4:1 to approximately 1:3.4. In certain embodiments, the powder precursors of one or both of the first and second cap materials can have a particle size of about 100 nm to about 150 μm, e.g., about 10 μm to about 150 μm, or about 100 nm to about 10 μm, e.g., about 5 μm or less. Additionally, or alternatively, in certain embodiments and in any suitable combination with any of the ratios provided herein (or any other ratio) or any of the cap material particle sizes provided herein (or any other cap material particle sizes), the powder precursor of the p-type or n-type material can have a particle size in the range of about 10 nm to about 100 μm, e.g., 10 nm to about 1 μm, e.g., about 100 nm, or, e.g., about 44 μm. Some exemplary, nonlimiting combinations of particle sizes are described in greater detail herein.

Alternatively, or additionally, without wishing to be bound by any theory, it is believed that a capability of sorting diced legs is useful, and potentially can even be critical for certain applications, in order to discard the numerous "failing" legs that do not pass the resistance criterion. Metal caps can be formed according to certain embodiments of the present invention that are thick enough to allow the current spreading necessary to perform consistent, accurate, and repeatable through-plane resistance measurements, which makes it possible to measure electrical properties on individual leg-level so that the deviant or poorer performing leg samples can be discarded, and the top or better performing leg performers can be selectively placed in the most critical locations for assembling a thermoelectric system with relatively high efficiency and improved or optimal performance. Without wishing to be bound by any theory, such a measurement is not believed to be possible with only thin-film electrical contacts for reasons such as mentioned further elsewhere herein. It should be understood that the use of relatively thick metal caps can be, but need not necessarily, be combined with the use of certain particle sizes to form the p-type or n-type material and first and second caps.

Other potential exemplary benefits of certain embodiments of the present invention lie in the enhancement of mechanical robustness of individual thermoelectric legs diced from the co-sintered pellet with the metal-capped thermoelectric composite structure. Without wishing to be bound by any theory, it is believed that relatively thick metal caps (e.g., caps thicker than about 0.2 mm) formed according to some embodiments of the present invention can enable the thermoelectric material to successfully withstand dicing into smaller pieces as compared to relatively thin caps, especially as a thicker thermoelectric material layer may be desired. It is believed that without the mechanical reinforcement of the metal caps with a thickness greater than 0.2 mm, e.g., substantially greater than 0.2 mm, or substantially greater than 0.3 mm, the thermoelectric material can tend to crumble upon removal from the sintering dies or during dicing. Typical thermoelectric materials can have a much lower thermal expansion coefficient than the metal materials that serve as their electrodes. Thus it is common in such typical materials to have problems with delamination or cracking as these two dissimilar CTE materials are joined together. The co-sintered metal caps that can be formed according to some embodiments of the present invention can help to reduce or avoid this problem as the materials including their forms (e.g., powder particle size) can be chosen by design to have an intermediate thermal expansion coefficient, thus easing the transition between materials.

Alternate, or additional, benefits of certain embodiments of the present invention also lie in the enhancement of electrical robustness of individual thermoelectric legs diced from the co-sintered pellet with the metal-capped thermoelectric composite structure. Unlike many conventional cases of using a nanometer thick metal film at the both ends of thermoelectric material, where current has limited ability to spread across the entire sample, the metal caps co-sintered with the thermoelectric composite material can be many tens to hundreds of microns thick which allows current to more freely spread. The metal caps according to some embodiments of the present invention can help to provide a means of easily coupling, e.g., soldering or brazing, the thermoelectric legs to electrical connectors such as electrical leads and module shunts, for making the overall thermoelectric system and also can serve as a diffusion barrier preventing unwanted material migration during system operation. Co-sintered metal caps also can adhere relatively well to the thermoelectric material, thus reducing or preventing failure at the bond interface and resulting in a relatively low parasitic resistance due to similar properties to doped semiconductor impurity.

Figure 8:
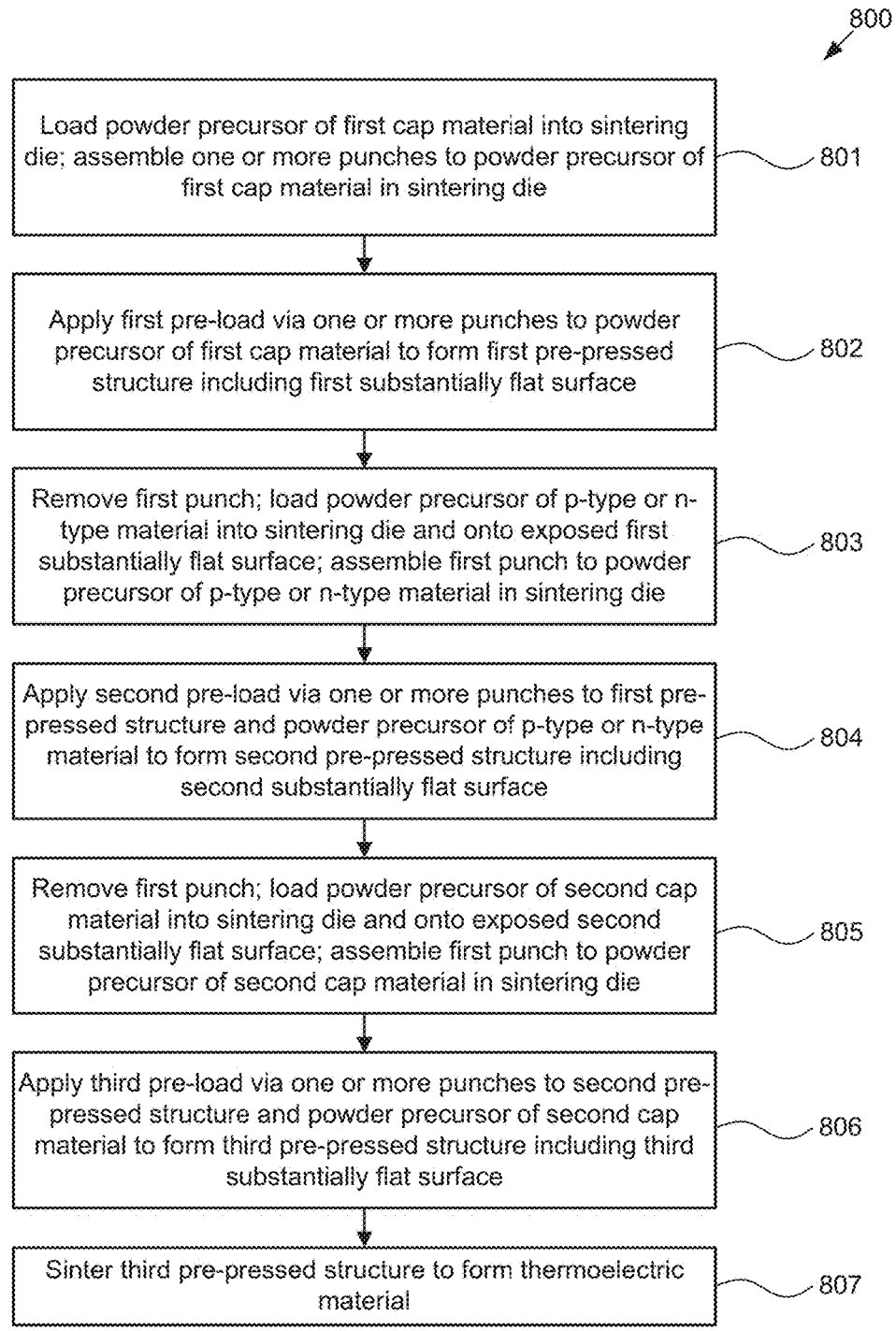
FIG. 8 illustrates steps in an exemplary method for forming a thermoelectric material according to certain embodiments of the present invention.

For example, Ni powder and $Mg_2Si$ powder are an exemplary, relatively good metal-thermoelectric material pair for forming an n-type thermoelectric leg with conductor caps using co-sintering such as described further herein with reference to FIG. 8. As another example, Cr powder and $MnSi_{1.73}$ powder have been shown to be another good metal-thermoelectric material pair for forming a p-type thermoelectric leg with conductor caps using co-sintering such as described further herein with reference to FIG. 8. Other TE material-metal combinations can also be used. Both p- and n-types of thermoelectric legs can be formed using the method described in some embodiments of the present invention and can be conveniently sorted out and selectively placed to desired positions for assembling a high performance thermoelectric module. Therefore, certain embodiments of the present methods can be relatively, or very, robust in making and sorting both the n-type and p-type thermoelectric legs such as to substantially improve the manufacturability of the thermoelectric power generation system. In a specific embodiment, using co-sintered metal caps eliminates at least one metallization process step by combining the metallization with the consolidation of the thermoelectric material.

In another embodiment, bulk-size metal-capped thermoelectric composite sandwich structure and methods for forming the same are provided. Merely by way of example, the invention has been applied to co-sinter metal powders and thermoelectric composite powders with selected material type, mass, particle size for forming a metal-capped thermoelectric composite pellet that can be diced into multiple thermoelectric legs without mechanical cracking or delamination of the metal cap and further is capable of easily sorting electrical, e.g., resistance, property of individual thermoelectric legs for the manufacture of thermoelectric systems.

FIG. 8 illustrates steps in an exemplary method for forming a thermoelectric material, according to certain embodiments of the present invention. This diagram is merely an example, which should not unduly limit the scope of the claims. One of ordinary skill in the art would recognize many variations, alternatives, and modifications. Method 800 illustrated in FIG. 8 includes loading a powder precursor of a first cap material into a sintering die, and assembling one or more punches to the powder precursor of the first cap material in the sintering die (801). For example, the powder precursor of the first cap material may include, or may consist essentially of, the elements of the first cap material. Exemplary cap materials and particle sizes are described elsewhere herein. In one illustrative, nonlimiting embodiment, the first cap material includes at least one transition metal, and the powder precursor of the first cap material includes a powder including the at least one transition metal. For example, the powder precursor of the first cap material can include, or can consist essentially of, a metallic powder. Exemplary metallic powders include nickel powder and chromium powder, although other non-limiting, exemplary metals and materials suitable for use in preparing a first cap material are mentioned elsewhere herein. Powders including at least one transition metal can be commercially purchased or can be prepared using mechanical ball milling or other suitable technique known in the art. In one illustrative embodiment, the sintering die can include a graphite material having, or being characterized by, a size of 20 mm or greater. In one illustrative embodiment, the sintering die can include one or more walls that define an aperture into which a first punch can be inserted, the powder precursor of the first cap material can be loaded onto the first punch, and a second punch can be loaded onto the powder precursor. In one example, the aperture is substantially cylindrical. In another example, the aperture is substantially square. In yet another example, the aperture is substantially rectangular. Other aperture shapes suitably can be used.

Method 800 illustrated in FIG. 8 also includes applying a first pre-load via the one or more punches to the powder precursor of the first cap material so as to form a first pre-pressed structure including a first flat or substantially flat surface (802). In some embodiments, the first pre-load can include a pressure in the range of approximately 2 MPa to approximately 80 MPa, e.g., in the range of approximately 10 MPa to approximately 50 MPa, such as approximately 15 MPa in one illustrative embodiment. It should be appreciated that applying the first pre-load to the powder precursor of the first cap material potentially can increase the temperature of the powder precursor of the first cap material. Additionally, or alternatively, the temperature can be, but need not necessarily be, varied during step 802, e.g., by heating the sintering die, such as by applying a current to the sintering die. Continuing with the above example in which the sintering die includes one or more walls that define an aperture into which a first punch can be inserted, the powder precursor of the first cap material can be loaded onto the first punch, and a second punch can be loaded onto the powder precursor, the first pre-load can be applied to the powder precursor of the first cap material via the first and second punches so as to form the first pre-pressed structure including a first substantially flat surface.

Method 800 illustrated in FIG. 8 also includes removing a first punch of the one or more punches so as to expose the first substantially flat surface; loading a powder precursor of a p-type or n-type material into the sintering die and onto the exposed first flat surface, and assembling the first punch to the powder precursor of the p-type or n-type material in the sintering die (803). For example, the powder precursor of the p-type or n-type material may include, or may consist essentially of, the elements of the p-type or n-type material. Exemplary p-type or n-type materials and particle sizes are described elsewhere herein. In one illustrative, nonlimiting embodiment, the p-type or n-type material includes a silicide, and the powder precursor of the p-type or n-type material includes a powder including the silicide. For example, the powder precursor of the p-type or n-type material can include, or can consist essentially of, magnesium silicide or manganese silicide, although other non-limiting, exemplary p-type or n-type materials suitable for use in preparing a p-type or n-type material are mentioned elsewhere herein. Powders including a p-type or n-type material can be commercially purchased or can be prepared using mechanical ball milling or other suitable technique known in the art. Continuing with the above example in which the sintering die includes one or more walls that define an aperture into which a first punch can be inserted, the powder precursor of the material can be loaded onto the first punch, and a second punch can be loaded onto the powder precursor, the second punch can be removed so as to expose the first flat surface of the first pre-pressed structure, the powder precursor of the p-type or n-type material can be disposed on the first flat surface, and the second punch then replaced.

Method 800 illustrated in FIG. 8 also includes applying a second pre-load via the one or more punches to the first pre-pressed structure and the powder precursor of the p-type or n-type material so as to form a second pre-pressed structure including a second flat or substantially flat surface (804). In some embodiments, the second pre-load can include a pressure in the range of approximately 2 MPa to approximately 80 MPa, e.g., in the range of approximately 10 MPa to approximately 50 MPa, such as approximately 15 MPa in one illustrative embodiment. It should be appreciated that applying the second pre-load to the first pre-pressed structure and the powder precursor of the p-type or n-type material potentially can increase the temperature of the first pre-pressed structure or of the powder precursor of the p-type or n-type material, or both. Additionally, or alternatively, the temperature can be, but need not necessarily be, varied during step 804, e.g., by heating the sintering die, such as by applying a current to the sintering die. Continuing with the above example, the second pre-load can be applied to the first pre-pressed structure and the powder precursor of the p-type or n-type material via the first and second punches so as to form the second pre-pressed structure including a second substantially flat surface.

Method 800 illustrated in FIG. 8 also includes removing the first punch so as to expose the second substantially flat surface; loading a powder precursor of a second cap material into the sintering die and onto the exposed second flat surface, and assembling the first punch to the powder precursor of the second cap material in the sintering die (805). For example, the powder precursor of the second cap material may include, or may consist essentially of, the elements of the second cap material. Exemplary cap materials and particle sizes are described elsewhere herein. In one illustrative, nonlimiting embodiment, the second cap material includes at least one transition metal, and the powder precursor of the second cap material includes a powder including the at least one transition metal. For example, the powder precursor of the second cap material can include, or can consist essentially of, a metallic powder. Exemplary metallic powders include nickel powder and chromium powder, although other non-limiting, exemplary metals and materials suitable for use in preparing a second cap material are mentioned elsewhere herein. The first and second cap materials can include, but need not necessarily include, the same materials as one another. Powders including at least one transition metal can be commercially purchased or can be prepared using mechanical ball milling or other suitable technique known in the art. Continuing with the above example, the second punch can be removed so as to expose the second flat surface of the second pre-pressed structure, the powder precursor of the p-type or n-type material can be disposed on the second flat surface, and the second punch then replaced.

Method 800 illustrated in FIG. 8 also includes applying a third pre-load via the one or more punches to the second pre-pressed structure and the powder precursor of the second cap material so as to form a third pre-pressed structure including a third flat or substantially flat surface (806). In some embodiments, the third pre-load can include a pressure in the range of approximately 2 MPa to approximately 80 MPa, e.g., in the range of approximately 10 MPa to approximately 50 MPa, such as approximately 15 MPa in one illustrative embodiment. It should be appreciated that applying the third pre-load to the second pre-pressed structure and to the powder precursor of the second cap material potentially can increase the temperature of the second pre-pressed structure or of the powder precursor of the second cap material, or both. Additionally, or alternatively, the temperature can be, but need not necessarily be, varied during step 806, e.g., by heating the sintering die, such as by applying a current to the sintering die. Continuing with the above example the third pre-load can be applied to the second pre-pressed structure and to the powder precursor of the second cap material via the first and second punches so as to form the third pre-pressed structure.

Method 800 illustrated in FIG. 8 also includes sintering the third pre-pressed structure so as to form the thermoelectric material (807). During such sintering, a suitable combination of temperature and pressure can be used so as to cause the materials of the third pre-pressed structure to fuse with one another. For example, the powder precursor of the first cap material can fuse so as to form the first cap material; the powder precursor of the p-type or n-type material can fuse so as to form the p-type or n-type material; and the powder precursor of the second cap material can fuse so as to form the second cap material. Additionally, the first cap material and the p-type or n-type material can fuse to one another so as to define a first interface, and the second cap material and the p-type or n-type material can fuse to one another so as to define a second interface. Exemplary ranges of pressures that can be applied to the third pre-pressed structure during such sintering can include approximately 2 MPa to approximately 80 MPa, e.g., in the range of approximately 30 MPa to approximately 60 MPa, such as approximately 60 MPa in one illustrative embodiment, or such as approximately 55 MPa in another illustrative embodiment, or such as approximately 50 MPa in another illustrative embodiment, or such as approximately 45 MPa in another illustrative embodiment, or such as approximately 40 MPa in another illustrative embodiment, or such as approximately 35 MPa in another illustrative embodiment, or such as approximately 30 MPa in another illustrative embodiment. Exemplary ranges of temperatures that can be applied to the third pre-pressed structure during such sintering can include approximately 300° C. to approximately 1000° C., e.g., in the range of approximately 300° C. to approximately 500° C., such as approximately 300° C. in one illustrative embodiment or approximately 500° C. in another illustrative embodiment, or in the range of approximately 500° C. to approximately 1000° C., such as in the range of approximately 800° C. to approximately 950° C., such as approximately 850° C. in one illustrative embodiment, or such as approximately 900° C. in another illustrative embodiment, or such as approximately 950° C. in yet another illustrative embodiment. It should be appreciated that any suitable combination of one or more temperatures and one or more pressures can be used.

For example, sintering the third pre-pressed structure can include applying a pressure to the third pre-pressed structure while ramping to an intermediate temperature and holding at that temperature for a first pre-determined period of time, and subsequently ramping to a higher temperature than the intermediate temperature and maintaining that temperature for a second pre-determined period of time. As another example, sintering the third pre-pressed structure can include ramping to a first intermediate pressure applied to the third pre-pressed structure; subsequently reducing to a second intermediate pressure; subsequently ramping to an intermediate temperature and holding at that temperature for a first pre-determined period of time; and subsequently ramping to a higher temperature than the intermediate temperature and holding at that temperature for a second pre-determined period of time. Optionally, such sintering of the third pre-pressed structure can include subsequently to ramping to the intermediate temperature, ramping to a higher pressure than the second intermediate pressure.

Without wishing to be bound by any theory, it is believed that method 800 illustrated in FIG. 8, or the use of suitable combinations of intermediate temperatures or pressures such as mentioned herein, or the combination of one or more pre-loads and one or more suitable intermediate temperatures or pressures can enhance bonding between the first cap material and the p-type or n-type material, as well as bonding between the second cap material and the p-type or n-type material; can reduce resistance of the first cap material; can reduce resistance of the second cap material; can reduce resistance of the p-type or n-type material; can reduce contact resistance between the first cap material and the p-type or n-type material; can reduce contact resistance between the second cap material and the p-type or n-type material; can enhance mechanical strength of the resultant thermoelectric material; can enhance flatness of the interface between the first cap material and the p-type or n-type material; can enhance flatness of the interface between the second cap material and the p-type or n-type material; can enhance the percentage or number of thermoelectric legs that meet a performance criterion, e.g., a resistance criterion, diced from that material; or can provide any suitable combination of such improvements.

Additionally, note that method 800 illustrated in FIG. 8, or the use of suitable combinations of intermediate temperatures or pressures such as mentioned herein, or the combination of one or more pre-loads and one or more suitable intermediate temperatures or pressures suitably can be, but need not necessarily be, combined with one or more other features provided herein. For example, as noted above, the first or second cap, or both, can be relatively thick, e.g., thicker than about 0.2 mm, so as to improve the ability to measure a performance of the thermoelectric material, e.g., to measure an electrical resistance of the thermoelectric material, among other benefits that such relatively thick caps can provide. Or, for example, as noted elsewhere herein, the absolute particle sizes or the particle size ratio, or both, can be selected so as to enhance the percentage or number of thermoelectric legs that meet a performance criterion, e.g., a resistance criterion, diced from the thermoelectric material. Some non-limiting examples of particle sizes and ratios are provided elsewhere herein.

Additionally, it should be appreciated that any suitable sintering method can be used so as to form the thermoelectric material. In one illustrative example, spark-plasma sintering (SPS) is used to sinter the third pre-pressed structure, e.g., by applying one or more suitable pressures to the third pre-pressed structure in a sintering die via one or more punches assembled to the sintering die, and by applying one or more suitable temperatures to the third pre-pressed structure, e.g., by pulsing a DC current that passes through the third pre-pressed structure, the sintering die, and the one or more punches. Other exemplary sintering methods include electric current assisted sintering such as capacitor discharge sintering or resistance sintering (which also may be referred to as hot pressing), and pressureless sintering.

Additionally, note that in embodiments that include preloading of the first cap material, of the p-type or n-type material, or of the second cap material, or a combination thereof, such preloading can be performed in any suitable order or combination. For example, the pre-loads respectively illustrated at steps 802, 804, 806 can be performed in the illustrated sequence, or in any other suitable sequence. For example, a first pre-load can be applied to the powder precursor of the first cap material at any suitable time so as to form a first pre-pressed structure, in a manner analogous to that described above with reference to step 802 of method 800 illustrated in FIG. 8. A second pre-load can be applied to the powder precursor of the p-type or n-type material at any suitable time, and the second pre-load need not necessarily also be applied to the first pre-pressed structure in addition to the powder precursor of the p-type or n-type material in a manner such as described above with reference to step 804 of method 900 illustrated in FIG. 8. Instead, in certain embodiments, the second pre-load can be applied solely to the powder precursor of the p-type or n-type material so as to form a second pre-pressed structure that is discrete and separate from the first pre-pressed structure. Additionally, or alternatively, a third pre-load can be applied to the powder precursor of the second cap material at any suitable time, and the third pre-load need not necessarily also be applied to the second pre-pressed structure in addition to the powder precursor of the second cap material in a manner such as described above with reference to step 906 illustrated in method 800 of FIG. 8. Instead, in certain embodiments, the third pre-load can be applied solely to the powder precursor of the second cap material so as to form a third pre-pressed structure that is discrete and separate from the first or second pre-pressed structure, or both. The first, second, and third pre-pressed structures subsequently can be stacked in a sintering die, e.g., with the second pre-pressed structure stacked upon the first pre-pressed structure, and the third pre-pressed structure stacked upon the second pre-pressed structure, and the first, second, and third pre-pressed structures then sintered together in a manner analogous to that described above with reference to step 807 of method 800 illustrated in FIG. 8. Alternatively, the first and second pre-pressed structures can be stacked and sintered together and subsequently sintered to the third pre-pressed structure, or the second and third pre-pressed structures can be stacked and sintered together and subsequently sintered to the first pre-pressed structure. Other permutations suitably can be used.

Some non-limiting, exemplary thermoelectric materials and devices and methods of forming and using the same now will be described.

In one illustrative example, the thermoelectric material includes magnesium silicide prepared by sintering magnesium silicide in powered form and the metal material includes metal prepared by co-sintering a metallic powder with the magnesium silicide in powdered form, e.g., includes nickel prepared by co-sintering nickel powder with the magnesium silicide in powdered form. In an implementation, the magnesium silicide in powered form is synthesized starting from Si and Mg elemental materials using a mechanical alloying ball mill process that resulted in an ultra fine powder. In one illustrative embodiment, the ball milling process is conducted in an argon environment with oxygen concentration under 200 ppm. Associated with the ball milling process, chemical reactions between Si and Mg powders take place to form $Mg_2Si$ in an ultra fine powder form with an average particle size of about 10 nm to about 100 µm, e.g., 10 nm to about 1 µm, e.g., about 100 nm. In one illustrative embodiment, the reacted powders are handled in a nitrogen environment to prevent oxidation of the $Mg_2Si$ material prior to the sintering process. The metallic powder, e.g., nickel powder, can have a particle size of about 100 nm to 150 µm, e.g., about 10 µm to about 150 µm, or about 100 nm to about 10 µm, e.g., about 5 µm or less. Illustratively, a particle size ratio of the $Mg_2Si$ ultrafine powder to the metallic powder is in the range of approximately 1:50 to approximately 50:1, or approximately 50:1 to 1:1, or approximately 1:50 to 1:1, e.g., in the range of approximately 20:1 to approximately 1:20, e.g., can be approximately 1:20, or can be in the range of approximately 10:1 to approximately 1:10, or can be in the range of approximately 5:1 to approximately 1:5.

In another implementation of the material preparation for the co-sintering process, the nickel powder is also handled in an inert environment, e.g., including Argon or Nitrogen.

In an alternative illustrative example, the thermoelectric material includes manganese silicide. In an implementation of the material preparation for the co-sintering process, the manganese silicide is ball milled in an argon environment to achieve particle size of about 10 nm to about 100 µm, e.g., 10 nm to about 1 µm, e.g., about 44 µm, or, e.g., smaller than 44 µm. In a specific, non-limiting embodiment, the formed manganese silicide powder is $MnSi_x$ (in one embodiment, x is about 1.73) powder. Correspondingly, in one illustrative embodiment, the metal layer precursor material to be co-sintered with the manganese silicide powder is selected to be chromium powder with a particle size of about 100 nm to 150 µm, e.g., about 10 µm to about 150 µm, or about 100 nm to about 10 µm, e.g., about 5 µm or less. Illustratively, a particle size ratio of the $MnSi_x$ ultrafine powder to the metallic powder is in the range of approximately 1:50 to approximately 50:1, or approximately 50:1 to 1:1, or approximately 1:50 to 1:1, e.g., in the range of approximately 20:1 to approximately 1:20, e.g., can be approximately 1:20, or can be in the range of approximately 10:1 to approximately 1:10, or can be in the range of approximately 5:1 to approximately 1:5, or can be in the range of approximately 4.4:1 to approximately 1:3.4.

Some benefits of certain embodiments of the present invention lie in proper selection of relevant materials with optimal powder particle sizes and masses for using co-sintering methods to form high-performance bulk thermoelectric composite material constrained by metal material. For example, in one non-limiting embodiment, to form a bulk (in millimeter scale) n-type thermoelectric material with two metal cap layers, about 1.4 g of magnesium silicide powder with particle diameter of about 100 nm can be co-sintered with two nickel caps using about 2.75 g in each cap and particle size of about 5 µm. In an embodiment, the impact of the powder particle sizes (of the selected materials) is shown in the measurement result of the contact resistance as well as in the delamination-free interface of the co-sintered metal-capped bulk thermoelectric composite pellet. The pellet thickness, according to certain embodiments of the present invention, can be as thin as 2-3 mm, or even thinner such as described elsewhere herein, without cracking. In certain embodiments, the Ni cap thickness can be 1-2 mm or more in thickness to enhance bonding strength for holding the 20 mm or larger sized pellet. When Ni powder with about 150 µm particle size was used, contact resistances between the thermoelectric and the metal cap layer is high (>20 mOhm). Alternatively, when Ni powder with about 5 µm or less particle size was used, contact resistances decreased significantly (smaller than a few mOhm). In one illustrative embodiment, the cross-sectional area of a thermoelectric material or thermoelectric leg characterized by such contact resistances (e.g., 2-10 mOhm) can be in the range of approximately 1.8 mm×1.8 mm and approximately 3.6 mm×1.8 mm, and the thickness of the p-type or n-type material can be in the range of approximately 0.5 mm to approximately 2.5 mm. Exemplary comparative results for thermoelectric legs diced from thermoelectric pellets formed using Ni powder with about 150 µm particle size or using Ni powder without about 5 µm or less particle size are described further above with reference to FIG. 7.

Figure 9A:
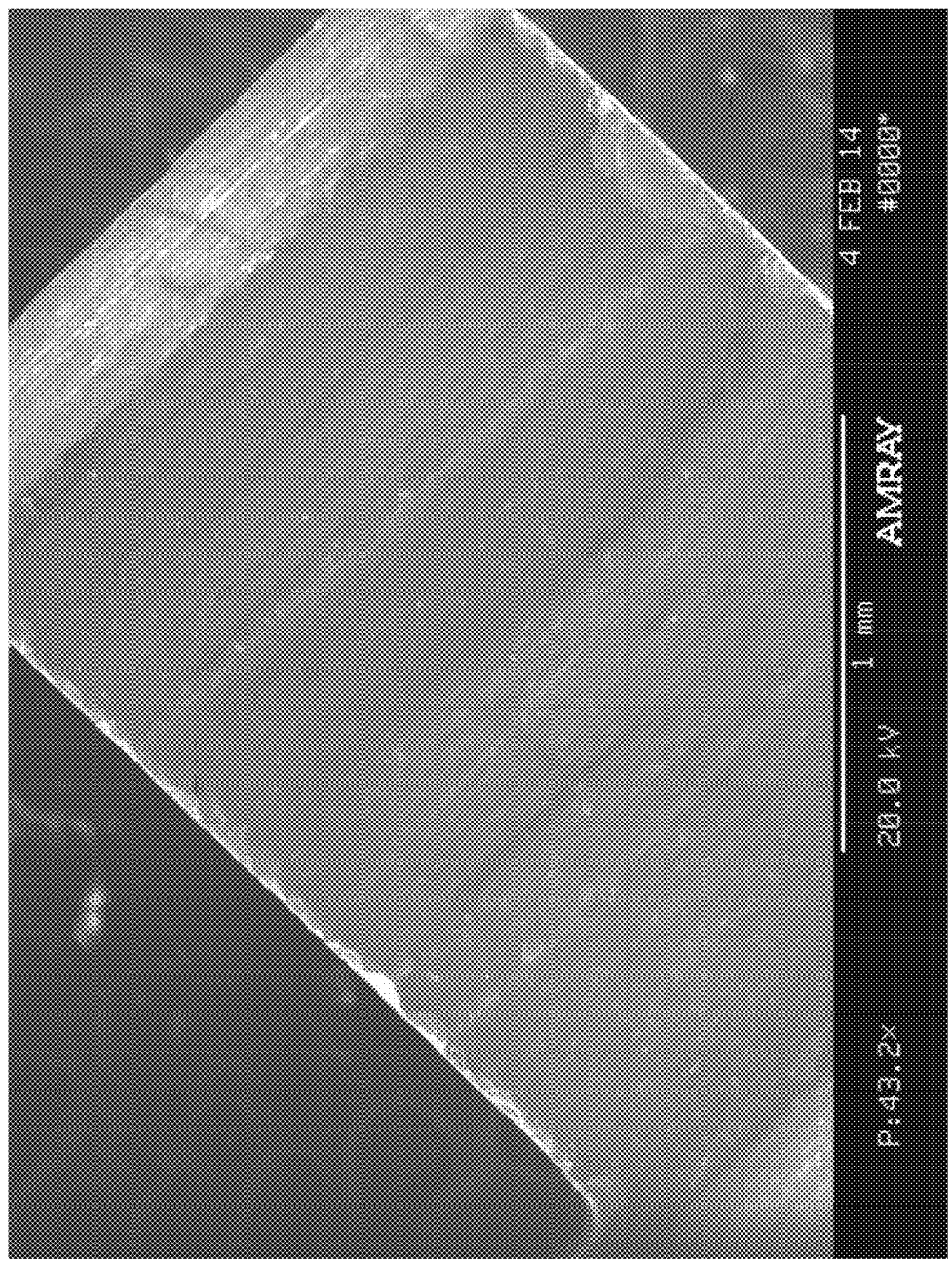
FIGS. 9A-9B are scanning electron microscope (SEM) images of an exemplary thermoelectric material according to certain embodiments of the present invention.
Figure 9B:
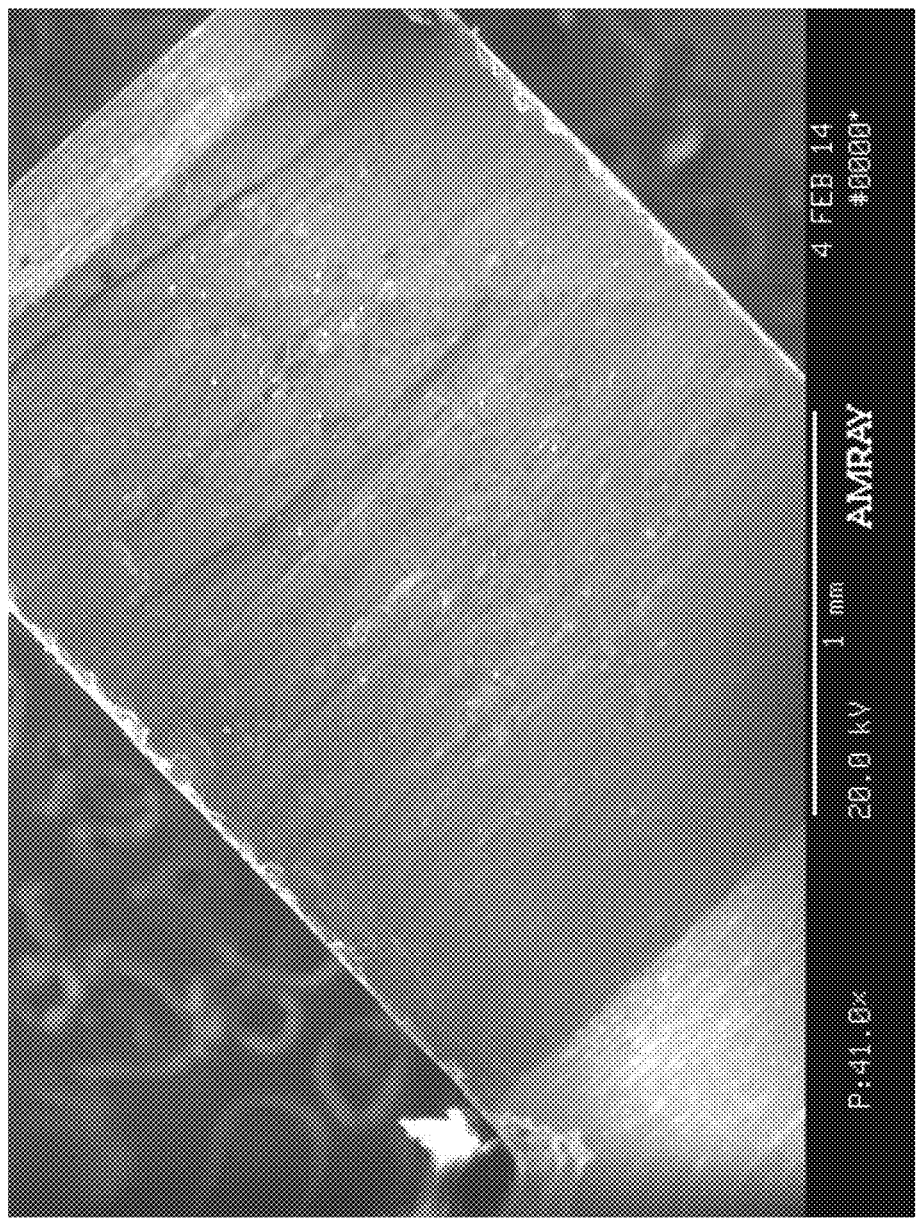

As another non-limiting example, a bulk p-type thermoelectric composite material can be made by co-sintering about 15.68 g manganese silicide as the thermoelectric powder (with particle size <44 µm) with two metal cap layers of about 10 g of chromium powder with particle size about 10 µm. FIGS. 9A-9B are scanning electron microscope (SEM) images of this exemplary thermoelectric material. These diagrams merely examples, which should not unduly limit the scope of the claims. One of ordinary skill in the art would recognize many variations, alternatives, and modifications. Just as with the magnesium silicide and nickel structure, it was found that the contact resistance of the manganese silicide with chromium caps went down significantly when finer chromium powder was used in the cap layer. In another embodiment, nickel was found not to bond onto manganese silicide, at least under the conditions used to attempt to prepare that particular pellet. The p-type manganese silicide pellet size, thickness, and chromium caps thickness can be also similar to that mentioned for n-type magnesium silicide pellet and nickel caps. Of course, variations and modifications of these parameters are not limited by the method described here, instead, the method is proven to be relatively, or very, scalable for making different sized thermoelectric legs for various applications. Methods such as described above with reference to FIG. 8 suitably can be used to sinter thermoelectric materials.

Without wishing to be bound by any theory, it is believed that the particle size of both the thermoelectric (p-type or n-type) precursor powder and cap precursor powders, e.g., metallic powders, is believed to play a useful and, in certain embodiments, an important role in the formation of an interface region between the sintered thermoelectric material in the middle region and two co-sintered metal layers as the top and bottom caps. For example, without wishing to be bound by any theory, it is believed that during the co-sintering process, high temperature and pressure can cause different particles to diffuse into void regions between particles and/or form neck-like structures with neighboring particles. Achieving strong interface adhesion and good electrical contact between the thermoelectric and metallic materials potentially can depend, at least in part, on properly choosing the size and type of powders for use in co-sintering. Strong adhesion is especially important for preventing pellet cracking or delamination of the metal layer through the dicing process. In some prior works of co-sintering a thermoelectric material with a metallic layer, the particle sizes of the thermoelectric material are orders of magnitude bigger, leading to relatively poor adhesion and relatively high contact resistance of the metallic layer with the thermoelectric material (e.g., $Mg_2Si$). According to certain embodiments, without wishing to be bound by any theory, it is believed that until the present invention, no successful method had been demonstrated for manufacturing a large pellet of a high performance thermoelectric composite material caped with two relatively thick metal caps in strong bonding and low contact resistance such that the large pellet could be diced into a plurality of thermoelectric legs without cracking and survive the high thermally-induced stresses of the sintering process.

In an alternative embodiment, the present invention provides an exemplary method for forming a thermoelectric composite sandwich structure that contains a bulk-size thermoelectric material capped with two metal thick layers. The exemplary method uses a co-sintering process to form this thermoelectric composite sandwich structure. The exemplary method includes steps of loading powder materials layer-by-layer into a sintering die and steps of pre-pressing each powder layer to create flat interfaces. In a specific embodiment, the exemplary method includes adding metal powders with pre-selected particle size into a sintering die. Further, the exemplary method includes a pre-pressing process which includes assembling punches to the sintering die associated with a SPS (Spark Plasma Sintering) tool and applying a pre-load of about 15 MPa through the punches to create a first flat or substantially flat surface for the loaded metal powder. Illustratively, the sintering die is provided by graphite material having, or being characterized by, a size of 20 mm or greater for improving the scalability of the manufacture of thermoelectric legs out of the bulk structure of thermoelectric composite with metal caps according to embodiments of the present invention.

The exemplary method further includes removing the top punch on the first flat or substantially flat surface of a bottom metal layer made by the loaded metal powder followed by adding thermoelectric powder material overlying the first flat or substantially flat surface of the bottom metal layer. The exemplary pre-pressing process mentioned above is repeated on the added thermoelectric powder material to create a second flat or substantially flat surface of a thermoelectric thick layer followed again by removing the corresponding top punch. Furthermore, the exemplary method includes adding metal powders overlying the second flat or substantially flat surface and adding top punch with load to form a top metal layer. Particularly, a tri-layer structure is formed including the top metal layer over the thermoelectric thick layer over the bottom metal layer. Moreover, the exemplary method includes conducting a co-sintering process applied to the tri-layer structure to form a bulk-size thermoelectric composite structure sandwiched by two metal cap layers. In a specific, non-limiting embodiment, the metal powders are Ni powders with fine particle size of about 5 µm or smaller and the thermoelectric powder material is selected from $Mg_2Si$ powders with ultra fine particle size of about 100 nm. In another specific, non-limiting embodiment, the metal powders are Cr powders with particle size of about 10 µm and the corresponding thermoelectric powder material is $MnSi_{1.73}$ powder with particle size of at least smaller than 44 μm.

In a specific, non-limiting embodiment, the co-sintering process includes ramping temperature from room temperature to about 850° C. with a rate of about 200° C./min. The temperature rise illustratively is achieved with a high pulsed DC current that passes through the sample and the tooling holding the sample. Illustratively, the pressure applied onto the tri-layer structure during the sintering can be about 50 MPa. Illustratively, the co-sintering process can be held at 850° C. for 8 minutes in an argon environment. In an alternative specific embodiment, the co-sintering process includes applying pressure of about 45 MPa onto the tri-layer structure and ramping then holding at 300° C. for 5 minutes, then ramping up to 850° C. and holding for 60 minutes in an argon environment. In yet another specific embodiment, the co-sintering process includes applying 30 MPa pressure onto the tri-layer structure while ramping to and holding at 500° C. for 6 minutes, then ramping up again to 850° C. and holding for 180 minutes in an argon environment. In still another specific embodiment, the co-sintering process includes applying about 30 MPa on the tri-layer structure and ramping to and holding at 500° C. for 6 minutes, then ramping up again to 950° C. and holding for 60 min in an argon environment. In a specific embodiment, a thermoelectric material $Mg_2Si$ pellet capped by thick Ni layers is used to form a plurality of n-type thermoelectric legs with conductor caps.

In another specific, non-limiting embodiment, the method includes an alternative co-sintering process for making a pellet of p-type thermoelectric material $MnSi_x$ ($x \approx 1.73$) capped by two Cr layers. The co-sintering process can be carried out on a loaded tri-layer structure (e.g., a $MnSi_x$ powder layer sandwiched by two Cr powder layers having flattened interfaces) in the SPS tooling in these steps: 1) without ramping temperature, ramping pressure to 80 MPa first and then settling at 15 MPa; 2) holding the pressure at 15 MPa, ramping temperature to 300° C. and holding there for 5 minutes; 3) ramping pressure again to 80 MPa and ramping temperature to 900° C. and holding there for 15 minutes; 4) cooling at a rate of 200° C./min back to room temperature.

In one of specific embodiment, graphite foil is used to prevent the powder material from sticking to the punch faces during the sintering process. Graphite tooling is also used due to its ability to withstand the desired sintering temperatures without deforming.

Other exemplary temperatures, pressures, sequences, steps, materials, particle sizes, and device dimensions are described elsewhere herein or suitably may be envisioned.

According to yet another embodiment, a method of forming a thermoelectric device includes preparing a thermoelectric material including a p-type or n-type material and first and second caps respectively including first and second cap materials respectively disposed on either side of the p-type or n-type material, the first and second cap materials each respectively including an independently selected transition metal. Forming the thermoelectric material can include loading a powder precursor of the first cap material into a sintering die; assembling one or more punches to the powder precursor of the first cap material in the sintering die; and applying a first pre-load via the one or more punches to the powder precursor of the first cap material to form a first pre-pressed structure including a first substantially flat surface. Forming the thermoelectric material further can include removing a first punch of the one or more punches to expose the first substantially flat surface; loading a powder precursor of the p-type or n-type material into the sintering die and onto the exposed first substantially flat surface; assembling the first punch to the powder precursor of the p-type or n-type material in the sintering die; and applying a second pre-load via the one or more punches to the first pre-pressed structure and the powder precursor of the p-type or n-type material to form a second pre-pressed structure including a second substantially flat surface. Forming the thermoelectric material further can include removing the first punch to expose the second substantially flat surface; loading a powder precursor of the second cap material into the sintering die and onto the exposed second substantially flat surface; assembling the first punch to the powder precursor of the second cap material in the sintering die; and applying a third pre-load via the one or more punches to the second pre-pressed structure and the powder precursor of the second cap to form a third pre-pressed structure. Forming the thermoelectric material further can include sintering the third pre-pressed structure to form the thermoelectric material; and coupling at least one of the first and second caps of the thermoelectric material to an electrical connector. For example, the method is implemented according to at least FIG. 8.

In another example, the method includes selecting the first and second cap materials so as to respectively include a coefficient of thermal expansion (CTE) that differs by 20% or less from a CTE of the p-type or n-type material. In another example, the method includes selecting the first and second cap materials so as to respectively include a coefficient of thermal expansion (CTE) that differs by 10% or less from a CTE of the p-type or n-type material. In another example, the first and second cap materials independently include one or more materials selected from the group consisting of Kovar, Cr, molybdenum, Ni—Fe alloy, and Cu—Mo alloy. In another example, the first and second cap materials independently include one or more materials selected from the group consisting of Kovar, Cr, molybdenum, and 50/50 Ni—Fe alloy. In another example, the CTE of the p-type or n-type material is approximately 6-8 ppm/° C. In another example, the first and second cap materials respectively independently include one or more materials selected from the group consisting of Ni, Monel, Dura Nickel, a Cu—Ni alloy, a Cu—Mo alloy, and Fe. In another example, the first and second cap materials respectively independently include one or more materials selected from the group consisting of Ni, Monel, Dura Nickel, Cu—Ni 30, and Cu—Ni 10. In another example, the CTE of the p-type or n-type material is approximately 13-17 ppm/° C.

In another example, neither of the first and second cap materials includes a silicide.

In another example, the method further includes dicing the thermoelectric material to form a plurality of individual thermoelectric legs. In another example, the method further includes respectively coupling at least one of first and second caps of each of four of the individual thermoelectric legs to the electrical connector. In another example, the method further includes testing an electrical resistance of each of the individual thermoelectric legs, and sorting the individual thermoelectric legs based on the tested electrical resistance.

In another example, the p-type or n-type material includes magnesium silicide or manganese silicide. In another example, the p-type or n-type material includes tetrahedrite or $Mg_2SiSn$. In another example, the powder precursor of the p-type or n-type material includes $Mg_2Si$ ultrafine powder formed based on Si and Mg elemental materials, and the powder precursors of the first and second cap materials include a metallic powder. In another example, the $Mg_2Si$ ultrafine powder is characterized by an average particle size of about 10 nm to about 1 μm. In another example, the $Mg_2Si$ ultrafine powder is characterized by an average particle size of about 100 nm. In another example, the $Mg_2Si$ ultrafine powder is formed and handled in an argon environment with oxygen concentration under 200 ppm before the sintering. In another example, the $Mg_2Si$ ultrafine powder is formed based on the Si and Mg elemental materials using a mechanical alloying ball mill process. In another example, the metallic powder includes nickel powder. In another example, the nickel powder is characterized by an average particle size of about 100 nm to about 10 μm. In another example, the nickel powder is characterized by an average particle size of about 5 μm or less. In another example, a particle size ratio of the $Mg_2Si$ ultrafine powder to the metallic powder is in the range of approximately 1:50 to approximately 50:1. In another example, a particle size ratio of the $Mg_2Si$ ultrafine powder to the metallic powder is approximately 1:20.

In yet another example, the powder precursor of the p-type or n-type material includes $MnSi_x$ ultrafine powder formed based on Si and Mn elemental materials, and the powder precursors of the first and second cap materials include a metallic powder. In another example, the $MnSi_x$ ultrafine powder is characterized by an average particle size of about 44 μm or smaller. In another example, the $MnSi_x$ ultrafine powder is formed and handled in an argon environment before the sintering. In another example, the $MnSi_x$ ultrafine powder is formed based on the Si and Mn elemental materials using a ball mill process. In another example, the metallic powder includes chromium powder. In another example, the chromium powder is characterized by an average particle size ranging from 100 nm to 150 μm in diameter. In another example, the chromium powder is characterized by an average particle size ranging from 10 μm to 150 μm in diameter. In another example, a particle size ratio of the $MnSi_x$ ultrafine powder to the metallic powder is in the range of approximately 50:1 to approximately 1:50. In another example, a particle size ratio of the $MnSi_x$ ultrafine powder to the metallic powder is in the range of approximately 4.4:1 to approximately 1:3.4. In another example, x is about 1.73.

In yet another example, a particle size ratio of the powder precursor of the p-type or n-type material to the powder precursors of the first and second cap materials is in the range of approximately 50:1 to approximately 1:50. In another example, a particle size ratio of the powder precursor of the p-type or n-type material to the powder precursors of the first and second cap materials is in the range of approximately 4.4:1 to approximately 1:3.4. In another example, a particle size ratio of the powder precursor of the p-type or n-type material to the powder precursors of the first and second cap materials is in the range of approximately 1:20.

In another example, a thickness of the thermoelectric material is approximately 0.5 mm to approximately 20 mm. In another example, a thickness of the thermoelectric material is approximately 2 mm to approximately 20 mm. In another example, a thickness of each of the first and second caps is approximately 0.2 mm to approximately 2 mm. In another example, a thickness of each of the first and second caps is approximately 1 mm to approximately 2 mm. In another example, a thickness of each of the first and second caps is greater than approximately 2 mm. In another example, the sintering die includes a graphite material being characterized by a size of 20 mm or greater.

In another example, the first, second, and third pre-loads each are in the range of approximately 2 MPa to approximately 80 MPa. In another example, the first, second, and third pre-loads each are about 15 MPa.

In another example, sintering the third pre-pressed structure includes applying a pressure to the third pre-pressed structure while ramping to an intermediate temperature and holding at that temperature for a first pre-determined period of time; and subsequently ramping to a higher temperature than the intermediate temperature and maintaining that temperature for a second pre-determined period of time. In another example, sintering the third pre-pressed structure includes ramping to a first intermediate pressure applied to the third pre-pressed structure; subsequently reducing to a second intermediate pressure; subsequently ramping to an intermediate temperature and holding at that temperature for a first pre-determined period of time; and subsequently ramping to a higher temperature than the intermediate temperature and holding at that temperature for a second pre-determined period of time. In another example, the sintering further includes, subsequently to ramping to the intermediate temperature, ramping to a higher pressure than the second intermediate pressure.

In yet another example, the sintering includes applying a pressure via the one or more punches to the third pre-pressed structure while: ramping a temperature of the third pre-pressed structure from room temperature to about 850° C. at a rate of about 200° C./min; and subsequently holding the third pre-pressed structure at about 850° C. for a pre-determined period of time. In another example, the pre-determined period of time is about 8 minutes. In another example, the pressure is about 50 MPa. In another example, the ramping is achieved with a pulsed DC current that passes through the third pre-pressed structure, the sintering die, and the one or more punches.

In yet another example, the sintering includes applying a pressure via the one or more punches to the third pre-pressed structure while: ramping a temperature of the third pre-pressed structure from room temperature to about 300° C.; subsequently holding the third pre-pressed structure at about 300° C. for a first pre-determined period of time; subsequently ramping the temperature of the third pre-pressed structure from 300° C. to about 850° C.; and subsequently holding the third pre-pressed structure at about 850° C. for a second pre-determined period of time. In another example, the first pre-determined period of time is about 5 minutes, and the second pre-determined period of time is about 60 minutes. In another example, the pressure is about 45 MPa.

In yet another example, the sintering includes applying a pressure via the one or more punches to the third pre-pressed structure while: ramping a temperature of the third pre-pressed structure from room temperature to about 500° C.; subsequently holding the third pre-pressed structure at about 500° C. for a first pre-determined period of time; subsequently ramping the temperature of the third pre-pressed structure from 300° C. to about 850° C.; and subsequently holding the third pre-pressed structure at about 850° C. for a second pre-determined period of time. In another example, the first pre-determined period of time is about 6 minutes, and the second pre-determined period of time is about 180 minutes. In another example, the pressure is about 30 MPa.

In yet another example, the sintering includes applying a pressure via the one or more punches to the third pre-pressed structure while: ramping a temperature of the third pre-pressed structure from room temperature to about 500° C.; subsequently holding the third pre-pressed structure at about 500° C. for a first pre-determined period of time; subsequently ramping the temperature of the third pre-pressed structure from 500° C. to about 950° C.; and subsequently holding the third pre-pressed structure at about 950° C. for a second pre-determined period of time. In another example, the first pre-determined period of time is about 6 minutes, and the second pre-determined period of time is about 60 minutes. In another example, the pressure is about 30 MPa.

In yet another example, the sintering includes: via the one or more punches, ramping a pressure to the third pre-pressed structure to about 80 MPa and then settling the pressure at 15 MPa; at the pressure of 15 MPa, subsequently ramping a temperature of the third pre-pressed structure from room temperature to about 300° C. and then holding the third pre-pressed structure at about 300° C. for a first pre-determined period of time; at the temperature of 300° C., subsequently ramping the pressure to about 80 MPa; at the pressure of 80 MPa, subsequently ramping the temperature of the third pre-pressed structure from 300° C. to about 900° C.; and subsequently holding the third pre-pressed structure at about 900° C. for a second pre-determined period of time. In another example, the first pre-determined period of time is about 5 minutes, and the second pre-determined period of time is about 15 minutes.

In another example, the sintering further includes, after holding the third pre-pressed structure at about 900° C. for the second pre-determined period of time, cooling the third pre-pressed structure at a rate of about 200° C./minute.

In yet another example, a cross-sectional area of the thermoelectric material is in the range of approximately 1.8 mm×1.8 mm and approximately 3.6 mm×1.8 mm; a thickness of the p-type or n-type material is in the range of approximately 0.5 mm to approximately 2.5 mm; and an electrical resistance of the thermoelectric material is in the range of approximately 2 mOhm to approximately 10 mOhm.

In another example, a thermoelectric device is provided that is prepared using the method of any one or more of the foregoing exemplary methods. For example, the device is implemented according to at least FIG. 3, FIGS. 4A-4D, FIGS. 5A-5B, FIG. 6, FIG. 7, FIG. 8, or FIGS. 9A-9B. In another example, such a thermoelectric device is used to generate a current or voltage. In another example, such a thermoelectric device is used to heat or cool a body to which the thermoelectric device is coupled.

According to yet another embodiment, a thermoelectric device includes a thermoelectric material including a p-type or n-type material and first and second caps respectively including first and second cap materials respectively disposed on either side of the p-type or n-type material, the first and second cap materials each respectively including an independently selected transition metal. The thermoelectric material can be formed by co-sintering a powder precursor of the first cap material, a powder precursor of the p-type or n-type material, and a powder precursor of the second cap material in a sintering die. A particle size ratio of the powder precursor of the p-type or n-type material to the powder precursors of the first and second cap materials can be in the range of approximately 1:1 to approximately 1:50. The device also can include an electrical connector, at least one of the first and second caps of the thermoelectric material being coupled to the electrical connector. For example, the device is implemented according to at least FIG. 3, FIGS. 4A-4D, FIGS. 5A-5B, FIG. 6, FIG. 7, FIG. 8, or FIGS. 9A-9B.

In another example, the first and second cap materials respectively include a coefficient of thermal expansion (CTE) that differs by 20% or less from a CTE of the p-type or n-type material. In another example, the first and second cap materials respectively include a coefficient of thermal expansion (CTE) that differs by 10% or less from a CTE of the p-type or n-type material. In another example, the first and second cap materials independently include one or more materials selected from the group consisting of Kovar, Cr, molybdenum, Ni—Fe alloy, and Cu—Mo alloy. In another example, the first and second cap materials independently include one or more materials selected from the group consisting of Kovar, Cr, molybdenum, and 50/50 Ni—Fe alloy. In another example, the CTE of the p-type or n-type material is approximately 6-8 ppm/° C. In another example, the first and second cap materials respectively independently include one or more materials selected from the group consisting of Ni, Monel, Dura Nickel, a Cu—Ni alloy, a Cu—Mo alloy, and Fe. In another example, the first and second cap materials respectively independently include one or more materials selected from the group consisting of Ni, Monel, Dura Nickel, Cu—Ni 30, and Cu—Ni 10. In another example, the CTE of the p-type or n-type material is approximately 13-17 ppm/° C. In another example, neither of the first and second cap materials includes a silicide. In another example, the thermoelectric device further includes a plurality of individual thermoelectric legs respectively formed by dicing the thermoelectric material. In another example, at least one of first and second caps of each of four of the individual thermoelectric legs is coupled to the electrical connector. In another example, a cross-sectional area of each of the individual thermoelectric legs is in the range of approximately 1.8 mm×1.8 mm and approximately 3.6 mm×1.8 mm; a thickness of the p-type or n-type material is in the range of approximately 0.5 mm to approximately 2.5 mm; and an electrical resistance of each of the individual thermoelectric legs is in the range of approximately 2 mOhm to approximately 10 mOhm.

In another example, the p-type or n-type material includes magnesium silicide or manganese silicide. In another example, the p-type or n-type material includes tetrahedrite or $Mg_2SiSn$. In another example, the powder precursor of the p-type or n-type material includes $Mg_2Si$ ultrafine powder formed based on Si and Mg elemental materials, and wherein the powder precursors of the first and second cap materials include a metallic powder. In another example, the $Mg_2Si$ ultrafine powder is characterized by an average particle size of about 10 nm to about 1 μm. In another example, the $Mg_2Si$ ultrafine powder is characterized by an average particle size of about 100 nm. In another example, the $Mg_2Si$ ultrafine powder is formed and handled in an argon environment with oxygen concentration under 200 ppm before the sintering. In another example, the $Mg_2Si$ ultrafine powder is formed based on the Si and Mg elemental materials using a mechanical alloying ball mill process. In another example, the metallic powder includes nickel powder. In another example, the nickel powder is characterized by an average particle size of about 100 nm to about 10 μm. In another example, the nickel powder is characterized by an average particle size of about 5 μm or less. In another example, a particle size ratio of the $Mg_2Si$ ultrafine powder to the metallic powder is approximately 1:20.

In yet another example, the powder precursor of the p-type or n-type material includes $MnSi_x$ ultrafine powder formed based on Si and Mn elemental materials, and the powder precursors of the first and second cap materials include a metallic powder. In another example, the $MnSi_x$ ultrafine powder is characterized by an average particle size of about 44 μm or smaller. In another example, the $MnSi_x$ ultrafine powder is formed and handled in an argon environment before the sintering. In another example, the MnSi$_x$ ultrafine powder is formed based on the Si and Mn elemental materials using a ball mill process. In another example, the metallic powder includes chromium powder. In another example, the chromium powder is characterized by an average particle size ranging from 100 nm to 150 µm in diameter. In another example, the chromium powder is characterized by an average particle size ranging from 10 µm to 150 µm in diameter. In another example, a particle size ratio of the MnSi$_x$ ultrafine powder to the metallic powder is in the range of approximately 4.4:1 to approximately 1:3.4. In another example, x is approximately 1.73.

In yet another example, a particle size ratio of the powder precursor of the p-type or n-type material to the powder precursors of the first and second cap materials is in the range of approximately 4.4:1 to approximately 1:3.4. In another example, a particle size ratio of the powder precursor of the p-type or n-type material to the powder precursors of the first and second cap materials is in the range of approximately 1:20. In another example, a thickness of the thermoelectric material is approximately 0.5 mm to approximately 20 mm. In another example, a thickness of the thermoelectric material is approximately 2 mm to approximately 20 mm. In another example, a thickness of each of the first and second caps is approximately 0.2 mm to approximately 2 mm. In another example, a thickness of each of the first and second caps is approximately 1 mm to approximately 2 mm. In another example, a thickness of each of the first and second caps is greater than approximately 2 mm.

In yet another example, the co-sintering includes: loading a powder precursor of the first cap material into a sintering die; assembling one or more punches to the powder precursor of the first cap material in the sintering die; and applying a first pre-load via the one or more punches to the powder precursor of the first cap material to form a first pre-pressed structure including a first substantially flat surface. The co-sintering further can include removing a first punch of the one or more punches to expose the first substantially flat surface; loading a powder precursor of the p-type or n-type material into the sintering die and onto the exposed first substantially flat surface; assembling the first punch to the powder precursor of the p-type or n-type material in the sintering die; and applying a second pre-load via the one or more punches to the first pre-pressed structure and the powder precursor of the p-type or n-type material to form a second pre-pressed structure including a second substantially flat surface. The co-sintering further can include removing the first punch to expose the second substantially flat surface; loading a powder precursor of the second cap material into the sintering die and onto the exposed second substantially flat surface; assembling the first punch to the powder precursor of the second cap material in the sintering die; and applying a third pre-load via the one or more punches to the second pre-pressed structure and the powder precursor of the second cap to form a third pre-pressed structure. The co-sintering further can include sintering the third pre-pressed structure to form the thermoelectric material.

In another example, any of the aforementioned thermoelectric devices can be used to generate a current or voltage. In another example, any of the aforementioned thermoelectric devices can be used to heat or cool a body to which the thermoelectric device is coupled.

According to still another embodiment, a method of forming a thermoelectric device can include providing a thermoelectric material including a p-type or n-type material and first and second caps respectively including first and second cap materials respectively disposed on either side of the p-type or n-type material, the first and second cap materials each respectively including an independently selected transition metal, wherein a thickness of each of the first and second caps is approximately 0.2 mm to approximately 2 mm. The method further can include dicing the thermoelectric material to form a plurality of individual thermoelectric legs; testing an electrical resistance of each of the individual thermoelectric legs; sorting the individual thermoelectric legs based on the tested electrical resistance; and coupling at least one of the first and second caps of at least one of the sorted individual thermoelectric legs to an electrical connector. For example, the method is implemented according to at least FIG. 6.

In another example, the method includes selecting the first and second cap materials so as to respectively include a coefficient of thermal expansion (CTE) that differs by 20% or less from a CTE of the p-type or n-type material. In another example, the method includes selecting the first and second cap materials so as to respectively include a coefficient of thermal expansion (CTE) that differs by 10% or less from a CTE of the p-type or n-type material. In another example, the first and second cap materials independently include one or more materials selected from the group consisting of Kovar, Cr, molybdenum, Ni—Fe alloy, and Cu—Mo alloy. In another example, the first and second cap materials independently include one or more materials selected from the group consisting of Kovar, Cr, molybdenum, and 50/50 Ni—Fe alloy. In another example, the CTE of the p-type or n-type material is approximately 6-8 ppm/° C. In another example, the first and second cap materials respectively independently include one or more materials selected from the group consisting of Ni, Monel, Dura Nickel, a Cu—Ni alloy, a Cu—Mo alloy, and Fe. In another example, the first and second cap materials respectively independently include one or more materials selected from the group consisting of Ni, Monel, Dura Nickel, Cu—Ni 30, and Cu—Ni 10. In another example, the CTE of the p-type or n-type material is approximately 13-17 ppm/° C. In another example, neither of the first and second cap materials includes a silicide. In another example, the p-type or n-type material includes magnesium silicide or manganese silicide. In another example, the p-type or n-type material includes tetrahedrite or Mg$_2$SiSn.

In another example, forming the thermoelectric material includes: loading a powder precursor of the first cap material into a sintering die; assembling one or more punches to the powder precursor of the first cap material in the sintering die; and applying a first pre-load via the one or more punches to the powder precursor of the first cap material to form a first pre-pressed structure including a first substantially flat surface. Forming the thermoelectric material also can include removing a first punch of the one or more punches to expose the first substantially flat surface; loading a powder precursor of the p-type or n-type material into the sintering die and onto the exposed first substantially flat surface; assembling the first punch to the powder precursor of the p-type or n-type material in the sintering die; and applying a second pre-load via the one or more punches to the first pre-pressed structure and the powder precursor of the p-type or n-type material to form a second pre-pressed structure including a second substantially flat surface. Forming the thermoelectric material also can include removing the first punch to expose the second substantially flat surface; loading a powder precursor of the second cap material into the sintering die and onto the exposed second substantially flat surface; assembling the first punch to the powder precursor of the second cap material in the sintering die; and applying a third pre-load via the one or more punches to the second pre-pressed structure and the powder precursor of the second cap to form a third pre-pressed structure. Forming the thermoelectric material further can include sintering the third pre-pressed structure to form the thermoelectric material.

In another example, the powder precursor of the p-type or n-type material includes $Mg_2Si$ ultrafine powder formed based on Si and Mg elemental materials, and the powder precursors of the first and second cap materials include a metallic powder. In another example, the $Mg_2Si$ ultrafine powder is characterized by an average particle size of about 10 nm to about 1 µm. In another example, the $Mg_2Si$ ultrafine powder is characterized by an average particle size of about 100 nm. In another example, the $Mg_2Si$ ultrafine powder is formed and handled in an argon environment with oxygen concentration under 200 ppm before the sintering. In another example, the $Mg_2Si$ ultrafine powder is formed based on the Si and Mg elemental materials using a mechanical alloying ball mill process. In another example, the metallic powder includes nickel powder. In another example, the nickel powder is characterized by an average particle size of about 100 nm to about 10 µm. In another example, the nickel powder is characterized by an average particle size of about 5 µm or less. In another example, a particle size ratio of the $Mg_2Si$ ultrafine powder to the metallic powder is in the range of approximately 1:50 to approximately 50:1. In another example, a particle size ratio of the $Mg_2Si$ ultrafine powder to the metallic powder is approximately 1:20.

In yet another example, the powder precursor of the p-type or n-type material includes $MnSi_x$ ultrafine powder formed based on Si and Mn elemental materials, and the powder precursors of the first and second cap materials include a metallic powder. In another example, the $MnSi_x$ ultrafine powder is characterized by an average particle size of about 44 µm or smaller. In another example, the $MnSi_x$ ultrafine powder is formed and handled in an argon environment before the sintering. In another example, the $MnSi_x$ ultrafine powder is formed based on the Si and Mn elemental materials using a ball mill process. In another example, the metallic powder includes chromium powder. In another example, the chromium powder is characterized by an average particle size ranging from 100 nm to 150 µm in diameter. In another example, chromium powder is characterized by an average particle size ranging from 10 µm to 150 µm in diameter. In another example, a particle size ratio of the $MnSi_x$ ultrafine powder to the metallic powder is in the range of approximately 50:1 to approximately 1:50. In another example, a particle size ratio of the $MnSi_x$ ultrafine powder to the metallic powder is in the range of approximately 4.4:1 to approximately 1:3.4. In another example, x is about 1.73.

In yet another example, a particle size ratio of the powder precursor of the p-type or n-type material to the powder precursors of the first and second cap materials is in the range of approximately 50:1 to approximately 1:50. In another example, a particle size ratio of the powder precursor of the p-type or n-type material to the powder precursors of the first and second cap materials is in the range of approximately 4.4:1 to approximately 1:3.4. In another example, a particle size ratio of the powder precursor of the p-type or n-type material to the powder precursors of the first and second cap materials is in the range of approximately 1:20. In another example, a thickness of the thermoelectric material is approximately 0.5 mm to approximately 20 mm. In another example, a thickness of the thermoelectric material is approximately 2 mm to approximately 20 mm. In another example, a thickness of each of the first and second caps is approximately 1 mm to approximately 2 mm. In another example, a thickness of each of the first and second caps is greater than approximately 2 mm. In another example, the sintering die includes a graphite material characterized by a size of 20 mm or greater. In another example, the first, second, and third pre-loads each are in the range of approximately 2 MPa to approximately 80 MPa. In another example, the first, second, and third pre-loads each are about 15 MPa.

In another example, sintering the third pre-pressed structure includes: applying a pressure to the third pre-pressed structure while ramping to an intermediate temperature and holding at that temperature for a first pre-determined period of time; and subsequently ramping to a higher temperature than the intermediate temperature and maintaining that temperature for a second pre-determined period of time. In another example, sintering the third pre-pressed structure includes: ramping to a first intermediate pressure applied to the third pre-pressed structure; subsequently reducing to a second intermediate pressure; subsequently ramping to an intermediate temperature and holding at that temperature for a first pre-determined period of time; and subsequently ramping to a higher temperature than the intermediate temperature and holding at that temperature for a second pre-determined period of time. In another example, the sintering includes subsequently to ramping to the intermediate temperature, ramping to a higher pressure than the second intermediate pressure.

In another example, the sintering includes applying a pressure via the one or more punches to the third pre-pressed structure while: ramping a temperature of the third pre-pressed structure from room temperature to about 850° C. at a rate of about 200° C./min; and subsequently holding the third pre-pressed structure at about 850° C. for a pre-determined period of time. In another example, the pre-determined period of time is about 8 minutes. In another example, the pressure is about 50 MPa. In another example, the ramping is achieved with a pulsed DC current that passes through the third pre-pressed structure, the sintering die, and the one or more punches.

In another example, the sintering includes applying a pressure via the one or more punches to the third pre-pressed structure while: ramping a temperature of the third pre-pressed structure from room temperature to about 300° C.; subsequently holding the third pre-pressed structure at about 300° C. for a first pre-determined period of time; subsequently ramping the temperature of the third pre-pressed structure from 300° C. to about 850° C.; and subsequently holding the third pre-pressed structure at about 850° C. for a second pre-determined period of time. In another example, the first pre-determined period of time is about 5 minutes, and the second pre-determined period of time is about 60 minutes. In another example, the pressure is about 45 MPa.

In yet another example, the sintering includes applying a pressure via the one or more punches to the third pre-pressed structure while: ramping a temperature of the third pre-pressed structure from room temperature to about 500° C.; subsequently holding the third pre-pressed structure at about 500° C. for a first pre-determined period of time; subsequently ramping the temperature of the third pre-pressed structure from 300° C. to about 850° C.; and subsequently holding the third pre-pressed structure at about 850° C. for a second pre-determined period of time. In another example, the first pre-determined period of time is about 6 minutes, and the second pre-determined period of time is about 180 minutes. In another example, the pressure is about 30 MPa.

In still another example, the sintering includes applying a pressure via the one or more punches to the third pre-pressed structure while: ramping a temperature of the third pre-pressed structure from room temperature to about 500° C.; subsequently holding the third pre-pressed structure at about 500° C. for a first pre-determined period of time; subsequently ramping the temperature of the third pre-pressed structure from 500° C. to about 950° C.; and subsequently holding the third pre-pressed structure at about 950° C. for a second pre-determined period of time. In another example, the first pre-determined period of time is about 6 minutes, and wherein the second pre-determined period of time is about 60 minutes. In another example, the pressure is about 30 MPa.

In yet another example, the sintering includes: via the one or more punches, ramping a pressure to the third pre-pressed structure to about 80 MPa and then settling the pressure at 15 MPa; at the pressure of 15 MPa, subsequently ramping a temperature of the third pre-pressed structure from room temperature to about 300° C. and then holding the third pre-pressed structure at about 300° C. for a first pre-determined period of time; at the temperature of 300° C., subsequently ramping the pressure to about 80 MPa; at the pressure of 80 MPa, subsequently ramping the temperature of the third pre-pressed structure from 300° C. to about 900° C.; and subsequently holding the third pre-pressed structure at about 900° C. for a second pre-determined period of time. In another example, the first pre-determined period of time is about 5 minutes, and wherein the second pre-determined period of time is about 15 minutes. In another example, the sintering includes after holding the third pre-pressed structure at about 900° C. for the second pre-determined period of time, cooling the third pre-pressed structure at a rate of about 200° C./min.

In another example, a cross-sectional area of the sorted individual thermoelectric legs is in the range of approximately 1.8 mm×1.8 mm and approximately 3.6 mm×1.8 mm; a thickness of the p-type or n-type material is in the range of approximately 0.5 mm to approximately 2.5 mm; and an electrical resistance of the at least one of the sorted thermoelectric legs coupled to the electrical connector is in the range of approximately 2 mOhm to approximately 10 mOhm.

In another example, a thermoelectric device is provided that is prepared using the method of any one or more of the foregoing exemplary methods. For example, the device is implemented according to at least FIG. 3, FIGS. 4A-4D, FIGS. 5A-5B, FIG. 6, FIG. 7, FIG. 8, or FIGS. 9A-9B. In another example, such a thermoelectric device is used to generate a current or voltage. In another example, such a thermoelectric device is used to heat or cool a body to which the thermoelectric device is coupled.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A thermoelectric device including:
    a thermoelectric material including a p-type or n-type material and first and second caps respectively including first and second cap materials respectively disposed on either side of the p-type or n-type material, the first and second cap materials each respectively including an independently selected transition metal,
    the thermoelectric material being formed by co-sintering a powder precursor of the first cap material, a powder precursor of the p-type or n-type material, and a powder precursor of the second cap material in a sintering die,
    wherein a particle size ratio of the powder precursor of the p-type or n-type material to the powder precursors of the first and second cap materials is in the range of approximately 1:1 to approximately 1:50; and
    an electrical connector, at least one of the first and second caps of the thermoelectric material being coupled to the electrical connector.

2. The device of claim 1, wherein the first and second cap materials respectively include a coefficient of thermal expansion (CTE) that differs by 20% or less from a CTE of the p-type or n-type material.

3. The device of claim 1, wherein the first and second cap materials respectively include a coefficient of thermal expansion (CTE) that differs by 10% or less from a CTE of the p-type or n-type material.

4. The device of claim 3, wherein the first and second cap materials independently include one or more materials selected from the group consisting of Kovar, Cr, molybdenum, Ni—Fe alloy, and Cu—Mo alloy.

5. The device of claim 3, wherein the first and second cap materials independently include one or more materials selected from the group consisting of Kovar, Cr, molybdenum, and 50/50 Ni—Fe alloy.

6. The device of claim 5, wherein the CTE of the p-type or n-type material is approximately 6-8 ppm/° C.

7. The device of claim 3, wherein the first and second cap materials respectively independently include one or more materials selected from the group consisting of Ni, Monel, Dura Nickel, a Cu—Ni alloy, a Cu—Mo alloy, and Fe.

8. The device of claim 3, wherein the first and second cap materials respectively independently include one or more materials selected from the group consisting of Ni, Monel, Dura Nickel, Cu—Ni 30, and Cu—Ni 10.

9. The device of claim 8, wherein the CTE of the p-type or n-type material is approximately 13-17 ppm/° C.

10. The device of claim 1, wherein neither of the first and second cap materials includes a silicide.

11. The device of claim 1, including a plurality of individual thermoelectric legs respectively formed by dicing the thermoelectric material.

12. The device of claim 11, wherein at least one of first and second caps of each of four of the individual thermoelectric legs is coupled to the electrical connector.

13. The device of claim 11, wherein:
    a cross-sectional area of each of the individual thermoelectric legs is in the range of approximately 1.8 mm×1.8 mm and approximately 3.6 mm×1.8 mm;
    a thickness of the p-type or n-type material is in the range of approximately 0.5 mm to approximately 2.5 mm; and
    an electrical resistance of each of the individual thermoelectric legs is in the range of approximately 2 mOhm to approximately 10 mOhm.

14. The device of claim 1, wherein the p-type or n-type material includes magnesium silicide or manganese silicide.

15. The device of claim 14, wherein the powder precursor of the p-type or n-type material includes $Mg_2Si$ ultrafine powder formed based on Si and Mg elemental materials, and wherein the powder precursors of the first and second cap materials include a metallic powder.

16. The device of claim 15, the $Mg_2Si$ ultrafine powder being characterized by an average particle size of about 10 nm to about 1 μm.

17. The device of claim 15, the $Mg_2Si$ ultrafine powder being characterized by an average particle size of about 100 nm.

18. The device of claim 17, wherein the $Mg_2Si$ ultrafine powder is formed and handled in an argon environment with oxygen concentration under 200 ppm before the sintering.

19. The device of claim 15, wherein the $Mg_2Si$ ultrafine powder is formed based on the Si and Mg elemental materials using a mechanical alloying ball mill process.

20. The device of claim 15, wherein the metallic powder includes nickel powder.

21. The device of claim 20, the nickel powder being characterized by an average particle size of about 100 nm to about 10 μm.

22. The device of claim 20, the nickel powder being characterized by an average particle size of about 5 μm or less.

23. The device of claim 15, wherein a particle size ratio of the $Mg_2Si$ ultrafine powder to the metallic powder is approximately 1:20.

24. The device of claim 14, wherein the powder precursor of the p-type or n-type material includes $MnSi_x$ ultrafine powder formed based on Si and Mn elemental materials, and wherein the powder precursors of the first and second cap materials include a metallic powder.

25. The device of claim 24, the $MnSi_x$ ultrafine powder being characterized by an average particle size of about 44 μm or smaller.

26. The device of claim 24, wherein the $MnSi_x$ ultrafine powder is formed and handled in an argon environment before the sintering.

27. The device of claim 24, wherein the $MnSi_x$ ultrafine powder is formed based on the Si and Mn elemental materials using a ball mill process.

28. The device of claim 24, wherein the metallic powder includes chromium powder.

29. The device of claim 28, the chromium powder being characterized by an average particle size ranging from 100 nm to 150 μm in diameter.

30. The device of claim 28, the chromium powder being characterized by an average particle size ranging from 10 μm to 150 μm in diameter.

31. The device of claim 24, wherein a particle size ratio of the $MnSi_x$ ultrafine powder to the metallic powder is in the range of approximately 4.4:1 to approximately 1:3.4.

32. The device of claim 24, wherein x is approximately 1.73.

33. The device of claim 1, wherein the p-type or n-type material includes tetrahedrite or $Mg_2SiSn$.

34. The device of claim 1, wherein a particle size ratio of the powder precursor of the p-type or n-type material to the powder precursors of the first and second cap materials is in the range of approximately 4.4:1 to approximately 1:3.4.

35. The device of claim 1, wherein a particle size ratio of the powder precursor of the p-type or n-type material to the powder precursors of the first and second cap materials is in the range of approximately 1:20.

36. The device of claim 1, wherein a thickness of the thermoelectric material is approximately 0.5 mm to approximately 20 mm.

37. The device of claim 1, wherein a thickness of the thermoelectric material is approximately 2 mm to approximately 20 mm.

38. The device of claim 1, wherein a thickness of each of the first and second caps is approximately 0.2 mm to approximately 2 mm.

39. The device of claim 1, wherein a thickness of each of the first and second caps is approximately 1 mm to approximately 2 mm.

40. The device of claim 1, wherein a thickness of each of the first and second caps is greater than approximately 2 mm.

41. The device of claim 1, wherein the co-sintering includes:
    loading a powder precursor of the first cap material into a sintering die;
    assembling one or more punches to the powder precursor of the first cap material in the sintering die;
    applying a first pre-load via the one or more punches to the powder precursor of the first cap material to form a first pre-pressed structure including a first substantially flat surface;
    removing a first punch of the one or more punches to expose the first substantially flat surface;
    loading a powder precursor of the p-type or n-type material into the sintering die and onto the exposed first substantially flat surface;
    assembling the first punch to the powder precursor of the p-type or n-type material in the sintering die;
    applying a second pre-load via the one or more punches to the first pre-pressed structure and the powder precursor of the p-type or n-type material to form a second pre-pressed structure including a second substantially flat surface;
    removing the first punch to expose the second substantially flat surface;
    loading a powder precursor of the second cap material into the sintering die and onto the exposed second substantially flat surface;
    assembling the first punch to the powder precursor of the second cap material in the sintering die;
    applying a third pre-load via the one or more punches to the second pre-pressed structure and the powder precursor of the second cap to form a third pre-pressed structure; and
    sintering the third pre-pressed structure to form the thermoelectric material.

* * * * *